United States Patent

Kawamura et al.

Patent Number: 5,731,123
Date of Patent: Mar. 24, 1998

[54] POSITIVE IMAGE FORMING COMPOSITION

[75] Inventors: Koichi Kawamura; Kazuya Uenishi, both of Shizuoka, Japan

[73] Assignee: Fuji Photo Film Co., Ltd., Minami-ashigara, Japan

[21] Appl. No.: 791,901

[22] Filed: Jan. 31, 1997

[30] Foreign Application Priority Data

Feb. 2, 1996 [JP] Japan .................... 8-017746

[51] Int. Cl.$^6$ .................... G03F 7/021; G03F 7/039
[52] U.S. Cl. .................... 430/176; 430/170; 430/191; 430/270.1; 430/905; 430/910; 430/920; 430/921; 430/926
[58] Field of Search .................... 430/270.1, 910, 430/176, 170, 191, 926, 905, 920, 921

[56] References Cited

U.S. PATENT DOCUMENTS

| | | | |
|---|---|---|---|
| 4,289,865 | 9/1981 | Wilson et al. | 430/270.1 |
| 4,396,702 | 8/1983 | Desai et al. | 430/270.1 |
| 4,419,437 | 12/1983 | Noonan et al. | 430/270.1 |
| 4,869,995 | 9/1989 | Shirai et al. | 430/270.1 |
| 4,889,791 | 12/1989 | Tsuchiya et al. | 430/270.1 |
| 4,980,268 | 12/1990 | Bartmann et al. | 430/270.1 |
| 5,213,946 | 5/1993 | Shirai et al. | 430/270.1 |
| 5,338,641 | 8/1994 | Pawlowski et al. | 430/191 |
| 5,372,914 | 12/1994 | Naito et al. | 430/270.1 |
| 5,374,504 | 12/1994 | Hanson et al. | 430/270.1 |
| 5,424,166 | 6/1995 | Pawlowski et al. | 430/176 |
| 5,563,022 | 10/1996 | Binder et al. | 430/910 |

*Primary Examiner*—John S. Chu
*Attorney, Agent, or Firm*—Burns, Doane, Swecker & Mathis, LLP

[57] ABSTRACT

Provided is a positive image forming composition which comprises (a) a compound generating an acid when exposed to light or heat and (b) a sulfonimide compound represented by the following formula (I):

$$L_1-(SO_2-NR_2-SO_2-R_1)_n \qquad (I)$$

wherein n is an integer from 1 to 6; $R_1$ is an aromatic group or an alkyl group; $L_1$ is an aromatic group or an alkyl group in the case of n=1, while it is a polyvalent organic linkage group in the case of n=2–6; and $R_2$ is an alkoxymethyl group, an arylmethyl group, or an alicyclic alkyl group; or a polymer containing in side chains constitutional units represented by the following formula (I'):

$$-L-SO_2-NR^2-SO_2-R^1 \qquad (I')$$

wherein $R^1$ has the same meaning as $R_1$ in formula (I); L is a polyvalent organic group for connecting the constitutional unit of formula (I') to the polymer skeleton; and $R^2$ has the same meaning as $R_2$ in formula (I).

9 Claims, No Drawings

POSITIVE IMAGE FORMING COMPOSITION

FIELD OF THE INVENTION

The present invention relates to a positive image forming composition used in the processes of producing a lithographic printing plate, a semiconductor device such as IC, or a circuit substrate for liquid crystal, a thermal head or the like, and in other photofabrication processes. Further, the invention concerns a photosensitive composition which can be used as material for a positive working lithographic printing plate, particularly a positive working lithographic printing plate which requires no development-processing and has suitability for direct recording of digital signals from a computer.

BACKGROUND OF THE INVENTION

A generally used positive image forming composition is a composition comprising an alkali-soluble resin and a naphthoquinonediazide compound used as photosensitive material. As for the combination of these constituents, the combinations of novolak-type phenol resins with naphthoquinonediazido-substituted compounds are disclosed, e.g., in U.S. Pat. Nos. 3,666,473, 4,115,128 and 4,173,470, and the combinations of novolak resins prepared from cresols and formaldehyde with trihydroxybenzophenone-1,2-naphthoquinonediazide sulfonic acid esters are described as most typical compositions in L. F. Thompson, *Introduction to Microlithography*, No. 219, pp. 112–121, ACS publisher.

As for the positive photoresist constituted basically of a novolak resin and a quinonediazide compound, the novolak resin can provide high resistance to plasma etching and the naphthoquinonediazide compound functions as a dissolution inhibitor. Additionally, naphthoquinonediazide has a property of producing a carboxylic acid upon irradiation with light to lose the ability to inhibit dissolution, thereby heightening the solubility of a novolak resin in alkali.

From the aforementioned points of view, a large number of positive photoresist compositions which each comprise a novolak resin and a naphthoquinonediazide type photosensitive material have hitherto been developed and put to practical use. In the processing of lines having a width of the order of 0.8–2 μm, those compositions have accomplished satisfactory results.

With respect to integrated circuits, on the other hand, the integration degree thereof has become higher and higher in recent years. Thus, processing of super fine patterns having a line width of half micron or below has come to be required in the production of semiconductor substrates for VLSI and the like. In order to achieve the resolution required in the aforesaid case, the wavelengths used in an exposure apparatus for photolithography were getting shorter, and nowadays the utilization of deep ultraviolet light and excimer laser beams (XeCl, KrF, ArF) is being examined.

In cases where a conventional resist comprising a novolak resin and a naphthoquinonediazide compound is used for the pattern formation by the lithography using deep ultraviolet light or an excimer laser beam, it is difficult for the light to reach the lower part of the resist because a novolak resin and naphthoquinonediazide have strong absorption in the deep ultraviolet region, so that such a resist has low sensitivity and can merely provide a pattern profile having a tapered shape.

As one means to solve the aforementioned problems, chemically amplified resist compositions are disclosed, e.g., in U.S. Pat. No. 4,491,628 and European Patent 0,249,139. The chemically amplified positive resist compositions refer to the pattern forming materials of the type which generate acids in the irradiated area upon irradiation with radiation, such as deep ultraviolet light, to cause a reaction utilizing these acids as catalyst, thereby arising a difference of solubility in a developer between the irradiated area and the unirradiated area of the active radiation. By virtue of this property, a pattern can be formed on a substrate coated with a material of the foregoing type.

As examples of a chemically amplified resist composition, mention may be made of the combination of a compound capable of generating an acid by photolysis (which is called a photoacid generator, hereinafter) with acetal or O, N-acetal (JP-A-48-89003, wherein the term "JP-A" means an unexamined published Japanese patent application"), the combination of a photoacid generator with an orthoester or amidoacetal compound (JP-A-51-120714), the combination of a photoacid generator with a polymer containing acetal or ketal groups in its main chain (JP-A-53-133429), the combination of a photoacid generator with an enol ether compound (JP-A-55-129936), the combination of a photoacid generator with a polymer containing orthoester groups in its main chain (JP-A-56-17345), the combination of a photoacid generator with a tertiary alkyl ester compound (JP-A-60-3625), the combination of a photoacid generator with a silyl ester compound (JP-A-60-10247) and the combinations with a photoacid generator with silyl ether compounds (JP-A-60-37549 and JP-A-60-121446). Those combinations have a quantum yield greater than 1 in principle, so that they exhibit high sensitivity.

Similarly, the systems described, e.g., in JP-A-59-45439, JP-A-60-3625, JP-A-62-229242, JP-A-63-27829, JP-A-63-36240, JP-A-63-250642, *Polym. Eng. Sce.*, vol. 23, p. 1012 (1983); *ACS. Sym.*, vol. 242, p. 11 (1984); *Semiconductor World*, the November number, p. 91 (1987); *Macromolecules*, vol. 21, p. 1475 (1988); and *SPIE*, vol. 920, p. 42 (1988); wherein the compounds capable of generating acids by exposure to light and tertiary or secondary alkyl esters or carbonate compounds are combined, can be other examples of the systems of the type which, though they are stable upon storage at room temperature, decompose by heating in the presence of an acid to acquire solubility in an alkali. Such combination systems also have high sensitivity and their absorption in the deep ultraviolet region is weak, compared with a naphthoquinonediazide/novolak resin system. Thus, the use of those combination systems can also be effective in shortening the wavelengths of a light source. Further, the use of a sulfonimide compound as the compound to generate an acid by photolysis in those chemical amplification systems is described in JP-A-07-28245.

The foregoing chemically amplified positive resist compositions can be grouped into two main classes, namely a class of three-component systems comprising an alkali-soluble resin, a compound capable of generating an acid by exposure to radiation (a photoacid generator) and a compound capable of inhibiting the dissolution of an alkali-soluble resin containing groups decomposable by an acid (a dissolution inhibitor) and a class of two-component systems comprising a resin containing groups which are decomposed by the reaction with an acid to become soluble in an alkali and a photoacid generator.

Such a two- or three-component positive resist of chemical amplification type forms a resist pattern by undergoing a heat treatment in the presence of an acid generated from a photoacid generator by exposure to light and subsequent development. Herein, in proportion to the standing period from exposure to heat treatment (PEB treatment), the generated acid diffuses and the acid in the surface part of the resist is deactivated by basic impurities in the atmosphere, thereby causing a problem such that not only the sensitivity but also the profile and line width of a resist pattern obtained after development vary with the standing period.

Conversely to the aforesaid tendency to shorten the wavelengths of a light source in the field of microphotolithography, a growing interest in providing a printing plate which enables the image formation utilizing laser beams in the visible region, preferably an infrared semiconductor device, has recently been taken in the field of lithographic printing.

The photopolymers sensitive to near infrared rays are disclosed in European Patent 0,444,786, JP-A-63-208036 and JP-A-63-274592. Further, European Patent 0,652,483 discloses the material which requires no developer and uses an infrared laser beam as light source for image formation.

However, all of those materials have defects that their sensitivities are insufficient for practical use as printing plate and the non-image area thereof suffers scumming.

In general, the image forming materials as described above form images by undergoing development after exposure. However, the development step consumes plenty of time and labor, and what is worse it is undesirable for workers' safety and environmental preservation because it uses a developer of strong alkalinity (generally pH 13).

As a means to solve such a problem, the positive working lithographic printing materials using polyethylene oxide-resol resin associates are disclosed in U.S. Pat. Nos. 3,231,377 and 3,231,381. In addition, the positive working lithographic printing materials using photosensitive polyimides are disclosed in U.S. Pat. Nos. 3,694,208 and 3,533,798. Further, the positive working photosensitive compositions comprising photoinitiators capable of generating acids by exposure and polymers containing alkoxyalkyl esters as side chains are disclosed in U.S. Pat. No. 5,314,785 and European Patent 0,600,615.

Although the printing plates using those positive working photosensitive compositions can certainly produce images without development with an alkali or by undergoing treatment with neutral water, they are apt to give rise to scumming during the practical printing operation. Therefore, it is required to make further improvements in them. More specifically, for the reduction of scumming, it is required to enlarge a difference between the water wettability (ink repellency) and the ink receptivity, especially to increase the water wettability.

Recently, in the field of graphic arts utilizing lithography, an increasing interest have been taken in lithographic printing materials of the kink which enable the so-called direct platemaking, or to make a printing plate directly of digital signals from a computer by means of visible or infrared laser beams, in place of conventional systems using light sources (ultraviolet light) for exposure. For instance, JP-A-7-28242 discloses the platemaking without development-processing, wherein the polymer having sulfonimido groups is employed in a positive PS plate. This plate can make a clear discrimination between the water wettability and the ink receptivity, but its sensitivity is in a short wavelength region and, in other words, it does not have sensitivities high enough for practical use at the wavelengths of from visible to infrared light, particularly to laser beams.

The photopolymers responsive to near infrared rays are disclosed in European Patent 0,444,786, JP-A-63-208036 and JP-A-63-274592. In addition, the positive image forming material which is sensitive to infrared laser beams and requires no developer is disclosed in European Patent 0,652,483. However, those printing plates give rise to scumming in the non-image area upon long-range storage, particularly under a high temperature-high humidity condition, although they have sufficient sensitivity to infrared laser beams.

As mentioned above, the conventional positive PS plate utilizing a sulfonimido group-containing polymer is insufficient in sensitivity to light in the visible to infrared region, and the conventional positive image forming materials have a scumming problem although they have high sensitivity to infrared laser beams.

SUMMARY OF THE INVENTION

One object of the present invention is to provide a positive image forming composition which serves as a photoresist composition reduced in resist pattern deformation depending on the standing period from exposure to heat treatment.

Another object of the present invention is to provide a positive image forming composition useful for the production of an offset printing plate which has high sensitivity to light of various wavelengths in the UV to IR region and give rise to no scumming in the non-image area.

Still another object of the present invention is to provide a positive image forming composition which can be prepared with ease at a low cost, and moreover which comprises a compound capable of splitting in the presence of an acid.

Further object of the present invention is to provide a positive working lithographic printing plate which can afford stain-free printed matters even when it undergoes no development after exposure.

Another object of the present invention is to provide a positive working printing plate which has high sensitivity to light of wavelengths longer than 350 nm, especially to visible and infrared laser beams, excellent stability upon storage and no scumming in the non-image area.

As a result of intensive studies to attain the aforementioned objects, we have arrived at the present invention having the constitutions [1] to [9] described below.

[1] A positive image forming composition comprising (a) a compound generating an acid by the action of light or heat thereon and (b) a sulfonimide compound represented by the following formula (I):

$$L_1\text{---}(SO_2\text{---}NR_2\text{---}SO_2\text{---}R_1)_n \qquad (I)$$

wherein n is an integer from 1 to 6; $R_1$ represents an unsubstituted or substituted aromatic group or an unsubstituted or substituted alkyl group; $L_1$ represents an unsubstituted or substituted aromatic group or an unsubstituted or substituted alkyl group when n is 1, and it represents an unsubstituted or substituted polyvalent linkage group constituted of non-metallic atoms when n is from 2 to 6; and $R_2$ represents a substituted or unsubstituted alkoxymethyl group, a substituted or unsubstituted arylmethyl group, or a substituted or unsubstituted alicyclic alkyl group.

[2] A positive image forming composition according to the above constitution [1], wherein the substituent group $R_2$ in the sulfonimide compound of formula (I) is a benzyloxymethyl group, a methoxyethoxymethyl group, a tetrahydropyranyl group or a tetrahydrofuranyl group.

[3] A positive image forming composition according to the above constitution [1], wherein the substituent group $R_2$ in the sulfonimide compound of formula (I) is a p-methoxybenzyl group, a 2,4,6-trimethoxybenzyl group, a piperonyl group or a 9-anthranylmethyl group.

[4] A positive image forming composition according to the above constitution [1], wherein the substituent group $R_2$ in the sulfonimide compound of formula (I) is a cyclohexyl group or a dibenzosuberyl group.

[5] A positive image forming composition according to the above constitution [1], [2], [3] or [4], wherein the acid generating compound as (a) is at least one compound selected from the group consisting of trihalomethyl-substituted oxazole compounds, trihalomethyl-substituted s-triazine compounds, iodonium salts, sulfonium salts, diazonium salts, disulfone compounds and iminosulfonate compounds.

[6] A positive image forming composition according to the above constitution [1], [2], [3], [4] or [5], which further comprises a high molecular organic binder insoluble in water but soluble or at least swelling in an aqueous alkali solution.

[7] A positive image forming composition according to the above constitution [1], [2], [3], [4] or [5], which further comprises an infrared absorbing dye.

[8] A positive image forming composition according to the above constitution [1], wherein the sulfonimide compound as (b) is a sulfonimide compound of formula (I) wherein $R_1$ is a 4-methylphenyl group, n is 1, $L_1$ is a 4-methylphenyl group and $R_2$ is a benzyloxymethyl group, a p-methoxybenzyl group or a piperonyl group.

The present sulfonimide compound of formula (I) readily decomposes by the action of an acid thereon to produce alkali-soluble NH group(s).

The art of using a sulfonimide compound in a positive PS plate and a positive photoresist has been already known by the disclosure in JP-A-7-28245.

In the patent cited above, however, the decomposition of a sulfonimide compound takes place via the split in its sulfonimide structure due to the action of the absorbed light. Thus, that patent has neither description nor suggestion as to the decomposition of a sulfonimide structure due to the action of an acid.

As a result of our intensive study, it has been found that the sulfonimide compound as mentioned above can decompose efficiently in the presence of an acid to provide alkali-soluble NH group(s) only when particular groups are employed as substituent on the nitrogen atom in the sulfonimide structure.

Further, we have found that the combined use of an acid generator and such a sulfonimide compound as to have a particular substituent on the nitrogen atom can solve the problem of a resolution drop depending on the standing period after exposure, which has arisen in the field of resist materials for microlithography.

Furthermore, we have found that a printing plate having sensitivity high enough for practical use and no scum in the non-image area can be obtained by using such a sulfonimide compound as to have a particular substituent on the nitrogen atom, an acid generator and an infrared absorbing dye in combination.

In addition, our intensive studies have led to a discovery that, when the sulfonimide polymer as cited hereinbefore has a particular group as the substituent on the nitrogen atom in a sulfonimide structure, the resultant polymer can be efficiently decomposed by an acid to have a change from lipophilic (ink-receptivity) to hydrophilic (water wettability) in the sulfonimide structure due to the production of NH group.

Further, it has been discovered that a positive working printing plate which is sensitive to a practically useful light source and can be free from scumming without undergoing development after exposure can be obtained by the combined use of an acid generator and such a sulfonimide polymer as to have a particular substituent on the nitrogen atom in the sulfonimide structure.

Furthermore, it has been discovered that a positive working printing plate practically sufficient in sensitivity to infrared laser beams and scum-free in the non-image area can be obtained by the combined use of such a sulfonimide polymer as to have a particular substituent on the nitrogen atom in the sulfonimide structure, an acid generator and an infrared absorbing dye.

Also, it has been found that the combination of a sulfonimide polymer having particular substituents with an acid generator is sensitive to light sources useful in practice and can undergo conventional development after exposure to serve as a positive image forming material having high sensitivity.

More specifically, we have found that the following constitution [9] can solve the aforementioned problems, thereby achieving the present invention.

[9] A positive image forming composition comprising (a) a compound generating an acid by the action of light or heat thereon and (b) a polymer containing in side chains constitutional units represented by the following formula (I'):

wherein $R^1$ represents an unsubstituted or substituted aromatic group, or an unsubstituted or substituted alkyl group; L represents a polyvalent organic group constituted of nonmetal atoms, which is necessary for connecting the constitutional unit of formula (I') to the polymer skeleton; and $R^2$ represents a substituted or unsubstituted alkoxymethyl group, a substituted or unsubstituted arylmethyl group, or a substituted or unsubstituted alicyclic alkyl group.

In the mechanism of positive-image formation by the use of the present positive working lithographic plate material, a particular substituent on the nitrogen atom in the sulfonimide structure of the polymer containing sulfonimide groups is split off the nitrogen atom by the action of the acid from an acid generator used together with the polymer to provide a hydrophilic NH group, and thereby the property of the resulting film surface is changed greatly from lipophilic to hydrophilic. This change enables the solution of the scumming problem in the non-image area.

Moreover, as the present polymer can be decomposed by an acid due to the presence of particular $R^2$ groups in the sulfonimide groups contained in its side chains, the combined use of the present polymer with an acid generator, particularly an acid generator sensitive to light in the visible to infrared region, enables high-speed positive image formation by means of light in the visible to infrared region, particularly laser beams, which could not be realized by the use of conventional sulfonimide polymers.

DETAILED DESCRIPTION OF THE INVENTION

The present sulfonimide compounds represented by the foregoing formula (I) are illustrated below in detail.

When either $L_1$ in the case of n=1 or $R_1$ represents an unsubstituted or substituted aromatic group, the aromatic group includes both carbocyclic and heterocyclic aromatic groups. The carbocyclic aromatic group includes those containing 6 to 19 carbon atoms, preferably those containing 1 to 4 benzene rings, such as a phenyl group, a naphthyl group, an anthracenyl group and a pyrenyl group. As the heterocyclic aromatic group, those containing 3 to 20 carbon atoms and 1 to 5 hetero atoms are employed. Of these groups, a pyridyl group, a furyl group and benzene-condensed ring residues, such as a quinolyl group, a benzofuryl group, a thioxanthonyl group and a carbazolyl group, are preferred in particular. When either $L_1$ in the case of n=1 or $R_1$ represents an unsubstituted or substituted alkyl group, the alkyl group includes those containing 1 to 25 carbon atoms. Of these alkyl groups, straight-chain or branched alkyl groups containing 1 to 8 carbon atoms, such as a methyl group, an ethyl group, an isopropyl group and a t-butyl group, are preferred in particular.

When either $L_1$ in the case of n=1 or $R_1$ is a substituted carbocyclic aromatic group, a substituted heterocyclic aromatic group or a substituted alkyl group, the substituents of those groups include alkoxy groups containing 1 to 10 carbon atoms, such as a methoxy group and an ethoxy group; halogen atoms, such as a fluorine atom, a chlorine atom and a bromine atom; halogen-substituted alkyl groups, such as a trifluoromethyl group and a trichloromethyl group; alkoxycarbonyl or aryloxycarbonyl groups containing 2 to 15 carbon atoms, such as a methoxycarbonyl group, an ethoxycarbonyl group, a t-butyloxycarbonyl group and a p-chlorophenyloxycarbonyl group; a hydroxyl group; acyloxy groups, such as an acetyloxy group, a benzoyloxy group and a p-diphenylaminobenzoyloxy group; carbonate groups, such as a t-butyloxycarbonyloxy group; ether groups, such as a t-butyloxycarbonylmethyloxy group and a 2-pyranyloxy group; substituted and unsubstituted amino groups, such as an amino group, a dimethylamino group, a diphenylamino group, a morpholino group and an acetylamino group; thioether groups, such as a methylthio group and a phenylthio group; alkenyl groups, such as a vinyl group and a styryl group; a nitro group; a cyano group; acyl groups, such as a formyl group, an acetyl group and a benzoyl group; aryl groups, such as a phenyl group and a naphthyl group; and heterocyclic aromatic groups, such as a pyridyl group. Additionally, alkyl groups, such as a methyl group and an ethyl group, can further be included in the examples of a substituent present in a substituted carbocyclic or heterocyclic aromatic group represented by $R_1$ or $L_1$ in the case of n=1.

$L_1$ in the case of n=2–6 represents an unsubstituted or substituted polyvalent linkage group constituted of nonmetal atoms.

The expression "polyvalent linkage group constituted of nonmetal atoms" used above is intended to include those constituted of 1 to 60 carbon atoms, 0 to 10 nitrogen atoms, 0 to 50 oxygen atoms, 1 to 100 hydrogen atoms and 0 to 20 sulfur atoms. Specifically, the linkage groups formed by combining two or more of the following structural units are examples of a linkage group represented by $L_1$.

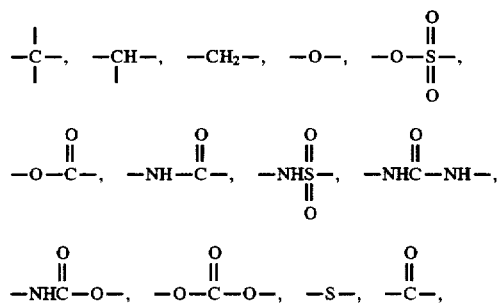

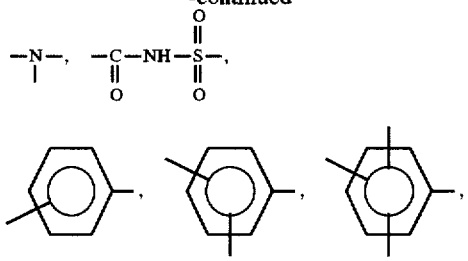

polyvalent naphthalene, polyvalent anthracene.

When the polyvalent linkage group has substituent(s), examples of such substituent(s) include alkyl groups containing 1 to 20 carbon atoms, such as methyl and ethyl groups; aryl groups containing 6 to 16 carbon atoms, such as phenyl and naphthyl groups; a hydroxyl group; a carboxyl group; a sulfonamido group; an N-sulfonylamido group; acyloxy groups containing 1 to 6 carbon atoms, such as an acetoxy group; alkoxy groups containing 1 to 6 carbon atoms, such as methoxy and ethoxy groups; halogen atoms, such as chlorine and bromine atoms; alkoxycarbonyl groups containing 2 to 7 carbon atoms, such as methoxycarbonyl, ethoxycarbonyl and cyclohexyloxycarbonyl groups; a cyano group; and carbonate groups, such as a t-butylcarbonate group.

The molecular weight of a compound represented by formula (I) is preferably in the range of 400 to 5,000, more preferably from 500 to 3,000.

When $R_2$ represents a substituted or unsubstituted alkoxymethyl group, the alkoxy moiety of such a group includes those containing 1 to 6 carbon atoms, such as methoxy and ethoxy groups. As for the substituent present in the substituted alkoxymethyl group, alkyl groups containing 1 to 6 carbon atoms and aryl groups, such as phenyl and naphthyl groups, are examples thereof. In the substituted alkoxymethyl group, groups having the carbon atom attached to the nitrogen atom at a branch point, such as 1-t-butoxy-ethyl, tetrahydrofuranyl and tetrahydropyranyl groups, are also included.

As the alkoxymethyl group represented by $R_2$, methoxyethoxymethyl, benzyloxymethyl, tetrahydrofuranyl and tetrahydropyranyl groups are preferred in particular.

The aryl moiety of a substituted or unsubstituted arylmethyl group includes aryl groups containing 6 to 14 carbon atoms, such as phenyl, naphthyl and anthranyl group.

As for the substituent present in the substituted arylmethyl group, alkoxy groups containing 1 to 4 carbon atoms and alkyl groups containing 1 to 4 carbon atoms are examples thereof.

Specific examples of such a substituted or unsubstituted arylmethyl group include p-methoxybenzyl, 2,4,6-trimethylbenzyl, piperonyl and 9-anthranylmethyl groups.

When $R_2$ is a substituted or unsubstituted alicyclic alkyl group, the alicyclic alkyl group includes those containing 5 to 7 carbon atoms. As for the substituent(s) such a group can have, a methoxy group, a phenyl group, a halogen atom and a benzene ring fused together with the aliphatic ring of that group are examples thereof.

Suitable examples of a substituted or unsubstituted alicyclic alkyl group include a cyclohexyl group and a dibenzosuberyl group.

Specific examples of a sulfonimide compound used in the present invention are illustrated below. However, the invention should not be construed as being limited to these examples.

1. 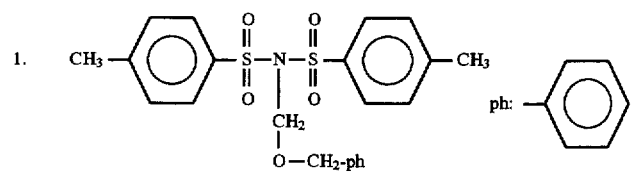
ph: (phenyl)
2. 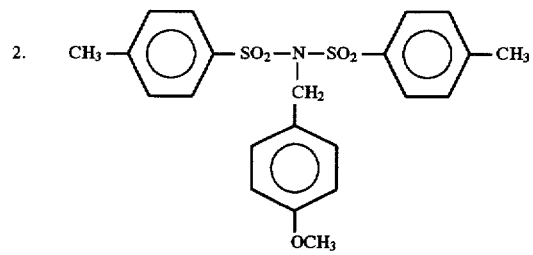
3. 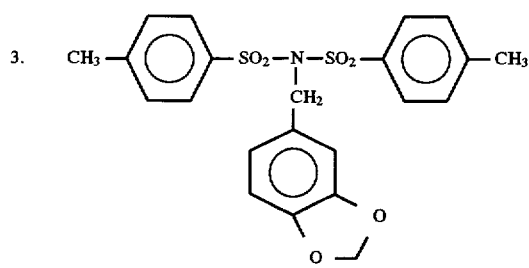
4. 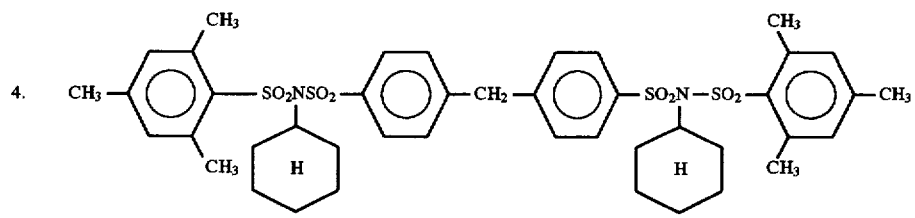
5. 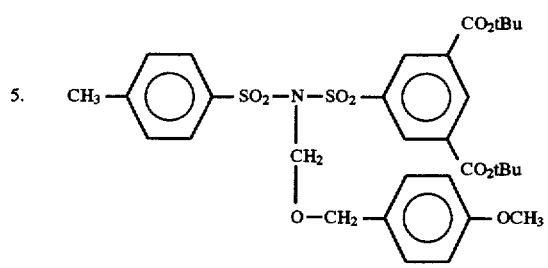
6. 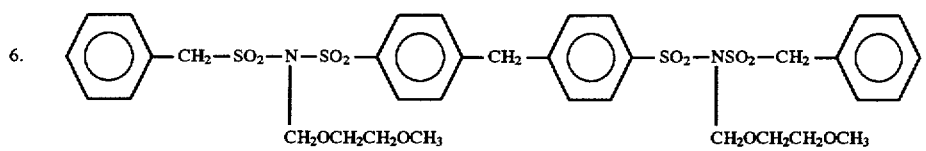
7. 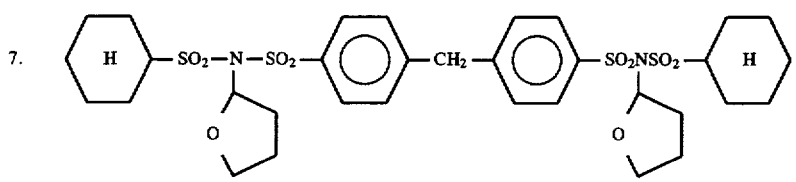

-continued
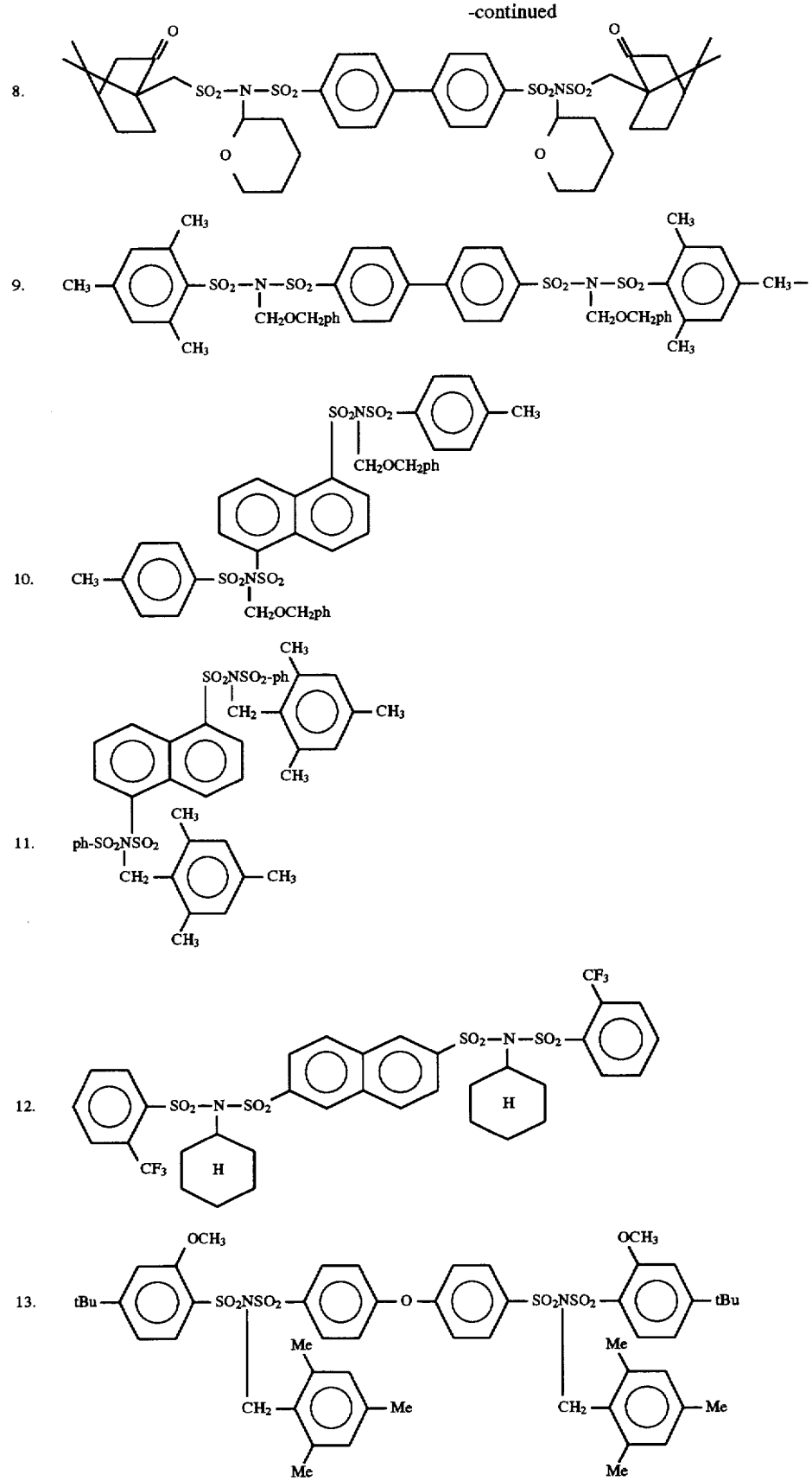

-continued

14. 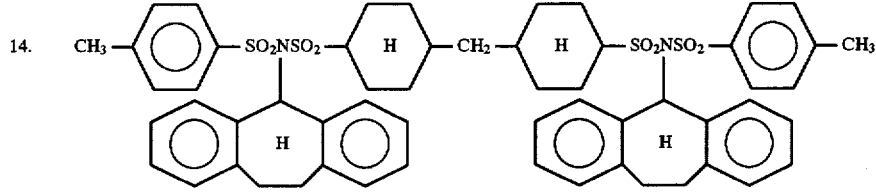

15. 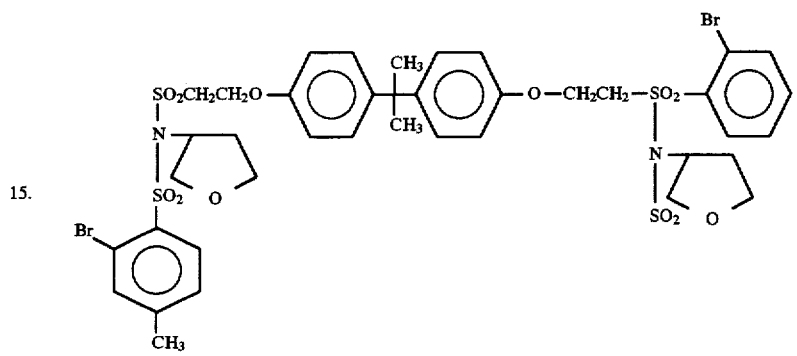

16. 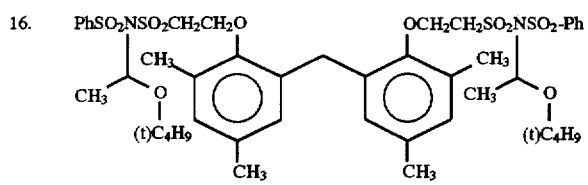

17. 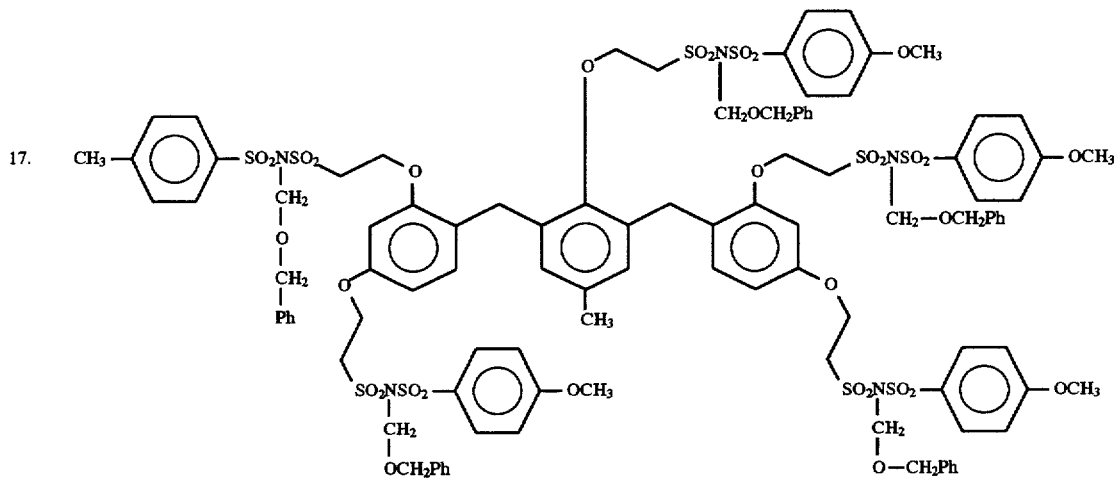

18. 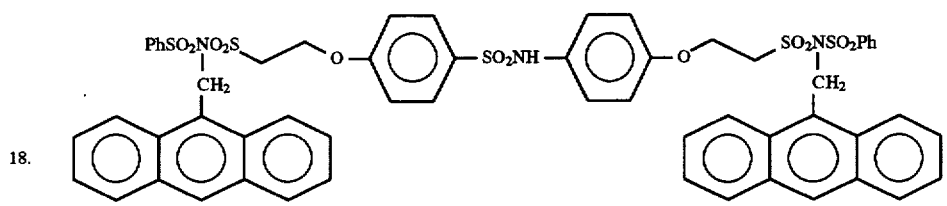

The compound represented by formula (I) is synthesized by reacting sulfonic acid chloride with an amine compound represented by the following formula (II), or prepared from a halogenated compound represented by the following formula (III) and a sulfonimide or the silver salt thereof:

$$NH_2—R_2 \quad (II)$$
$$Cl—R_2 \quad (III)$$

wherein $R_2$ has the same meaning as in formula (I).

Additionally, when $R_2$ in the formula (I) is a tetrahydropyranyl group, the compound can be synthesized using dihydropyran as a starting material, too.

Synthesis examples of the present sulfonimide compound are illustrated below.

SYNTHESIS EXAMPLE 1

Synthesis of Exemplified Compound 1

In a three necked flask, 61 g of p-toluenesulfonimide and 200 ml of N,N-dimethylacetamide were placed, and admixed with 22 g of triethylamine at room temperature with stirring. After the addition of triethylamine, 45 g of benzyl chloromethyl ether was further added, and the stirring was continued for 2 hours. Then, the reaction solution was poured into water to precipitate crystals. The crystals were filtered off, and recrystallized from a hexane-toluene mixed solvent. Thus, 53 g of white crystals was obtained in a 60% yield. mp 119°–120° C.

SYNTHESIS EXAMPLE 2
Synthesis of Exemplified Compound 2

The silver salt of p-toluenesulfonimide in an amount of 65 g was placed in a 2-liter three necked flask, and dissolved in 1 l of tetrahydrofuran. To this solution, 28 g of p-methoxybenzyl chloride was added dropwise under room temperature with stirring. After the dropwise addition, the stirring was further continued for 2 hours. The resulting reaction solution was admixed with 0.5 l of ethyl acetate to deposit precipitates. The precipitates were filtered out, and the filtrate was concentrated. The crystals thus obtained were recrystallized from a hexane-toluene mixed solvent to give 48 g of the intended compound, mp 145°–146° C.

SYNTHESIS EXAMPLE 3
Synthesis of Exemplified Compound 3

In a 1-liter three necked flask, 40 g of p-toluenesulfonyl chloride, 200 ml of acetonitrile and 21 g of triethylamine were placed, and thereto 16 g of piperonylamine was added dropwise over a 30-minute period with stirring under cooling in an ice bath. After the dropwise addition, the ice bath was removed, and the stirring of the reaction solution was continued for 5 hours at room temperature. Then, the reaction solution was admixed with 500 ml of water and 20 ml of 6N hydrochloric acid to precipitate crystals. These crystals were filtered off, and recrystallized from the water-acetonitrile (1:4 by volume) mixed solvent. Thus, 19.6 g of the intended compound, mp 157°–158° C., was obtained.

The compound of formula (I) is used in a proportion ranging generally from 5 to 95 weight %, preferably from 10 to 70 weight %, more preferably from 15 to 60 weight %, based on the total ingredients of the composition (except a coating solvent).

In the next place, the polymers having the constitutional units represented by the foregoing formula (I') are illustrated below in detail. The term polymer refers to the macromolecule of a molecular weight of from about several thousands to about several millions, which is derived by the mutual combinations of many, e.g., 10, 100, 1000 or above, smaller molecules. The smaller molecules combined mutually are, in general, called "monomer" or "prepolymer", and the mutual combination reaction is generally called "polymerization". The structure of a polymer is shown by an appropriate structural unit to be repeated and, in many cases, the structural unit to be repeated corresponds to the structural formula of a monomer or prepolymer used as starting material. For details of chemical properties, reactions, monomers, characteristics and nomenclature of polymers, Odian, Principles of Polymerization, 2nd edition, J. Weily & Son, New York (1981), and Encyclopedia of Polymer Science and Engineering, J. Weily & Son, New York (1988) should be consulted. The term "polymer" as used herein is intended to include both a homopolymer (or a polymer in which all the monomer units are the same) and a copolymer (or a polymer in which at least two kinds of monomer units are present).

As the specific examples of the unsubstituted or substituted aromatic group and the unsubstituted or substituted alkyl group represented by $R^1$, those mentioned for $R_1$ in formula (I) can be cited.

The polyvalent connecting group represented by L, which is constituted of nonmetal atoms, includes those constituted of 1 to 60 carbon atoms, 0 to 10 nitrogen atoms, 0 to 50 oxygen atoms, 1 to 100 hydrogen atoms and 0 to 20 sulfur atoms. Specifically, the connecting groups formed by combining two or more of the following structural units are examples of a connecting group represented by L.

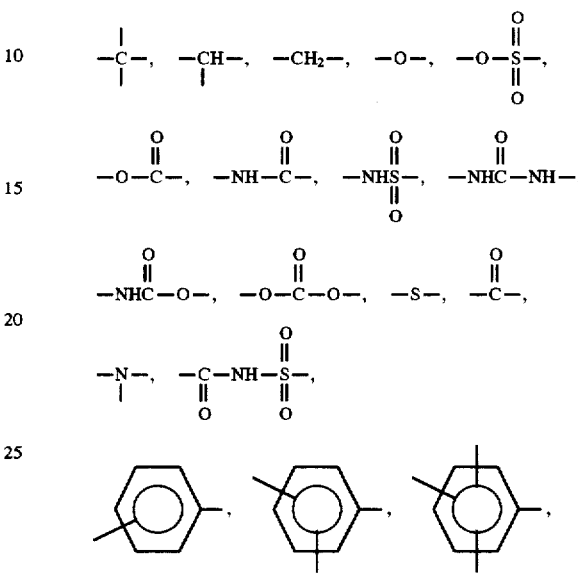

polyvalent naphthalene, polyvalent anthracene.

When the polyvalent connecting group as recited above has substituent(s), examples of such substituent(s) include alkyl groups containing 1 to 20 carbon atoms, such as methyl and ethyl groups; aryl groups containing 6 to 16 carbon atoms, such as phenyl and naphthyl groups; a hydroxyl group; a carboxyl group; a sulfonamido group; an N-sulfonylamido group; acyloxy groups containing 1 to 6 carbon atoms, such as an acetoxy group; alkoxy groups containing 1 to 6 carbon atoms, such as methoxy and ethoxy groups; halogen atoms, such as chlorine and bromine atoms; alkoxycarbonyl groups containing 2 to 7 carbon atoms, such as methoxycarbonyl, ethoxycarbonyl and cyclohexyloxycarbonyl groups; a cyano group; and carbonate groups, such as a t-butylcarbonate group.

As the specific examples of the unsubstituted or substituted alkoxymethyl group, the unsubstituted or substituted arylmethyl group and the unsubstituted or substituted alicyclic alkyl group represented by $R^2$, those mentioned for $R_2$ in formula (I) can be cited.

The polymers having the constitutional units of formula (I') in their side chains can be synthesized usually by polymerizing monomers obtained by connecting various reactive (polymerizable) groups to L of formula (I').

Therein, L is connected to a reactive or polymerizable group useful for the polymerization reaction to produce the polymer containing in its side chains the constitutional units represented by formula (I'). Typical examples of a reactive group useful for the polymerization reaction include a hydroxyl group; an isocyanate group; an amine; a carboxyl group; vinyl monomers, such as an acrylate, a methacrylate, a vinyl ester, an acrylamide, a methacrylamide and styrene; and cyclic ethers, which are not to be considered as limiting the scope of the reactants usable in the present invention.

In another case, L is chosen so as to contain a reactive group capable of combining with functional groups attached to a previously prepared polymer. Examples of such a reactive group include an isocyanate group, a hydroxyl group, an amine, a carboxyl group, an acid anhydride and an epoxy group. However, the reactive groups employable herein should not be construed as being limited to those examples.

Most of general polymers can be synthesized by using the structural units (monomers) composed of formula (I') and the reactive groups useful for polymerization reaction as recited above connected to L of formula (I'), and reacting them so as to constitute the side chains or be incorporated in the main chain. Specific examples of a general polymer include polyacrylate, polymethacrylate, polyacrylamide, polystyrene, acrylonitrile-styrene copolymers, butadiene-styrene copolymers, polyolefins (such as polyethylene, polypropylene and polyisobutylene), polyester, polyether, polycarbonate, polyurethane, polysiloxane, polyamide, phenol resins, poly(arylmethylene), polyacrylonitrile, polybutadiene, polyvinyl esters, polyvinyl alcohol, polyvinyl acetal, polyvinyl ether, polyvinyl pyrrolidone, polyvinyl pyridine, polyvinyl chloride, polyethylene oxide, polypropylene oxide, polyethylene glycol, polypropylene glycol, polyethyleneimine, epoxy resins, phenoxy resins, polytetrahydrofuran, polycaprolactone, poly(styrenesulfonic acid), gelatin, alkyl cellulose, hydroxyalkyl cellulose, carboxymethyl cellulose, starch and polysaccharide. However, these examples are not to be considered as limiting on the scope of the invention. The molecular weight of a polymer usable in the present invention can be in the range of several thousands to several millions.

Of those polymers, polyacrylate, polymethacrylate, polyacrylamide, polystyrene, polyester, polyurethane, phenol resins and epoxy resins are preferred over the others.

In a group of polymers well suited for the present invention, acrylic acid polymers, methacrylic acid polymers, polystyrenes and acrylamide polymers can be included because of their diversity in structure, their ease of syntheses, their good physical properties, and their capacity to provide satisfactory performances. A suitable method for preparation of the polymer as recited above consists in free radical polymerization of the structural unit of formula (I') bonded, via L, to a monomer moiety of an acrylate, methacrylate, acrylamide, methacrylamide or styrene moiety. Specific examples of such a monomer-substituted structural unit (sulfonimide monomer) are illustrated below:

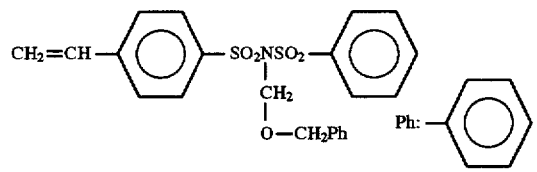
M-1.

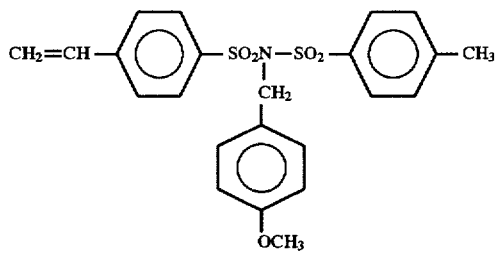
M-2.

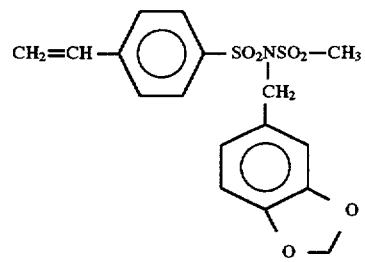
M-3.

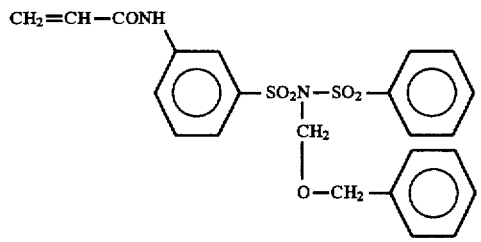
M-4.

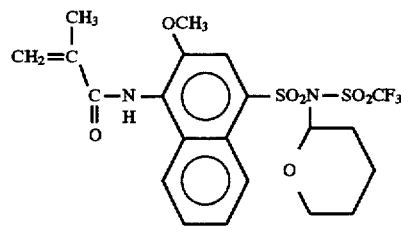
M-5.

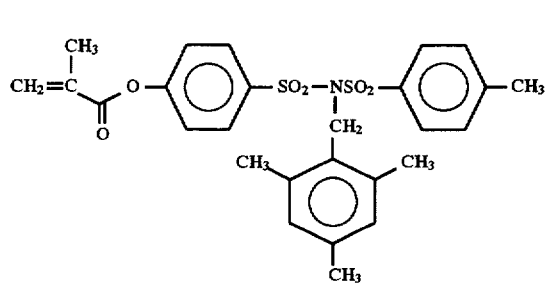
M-6.

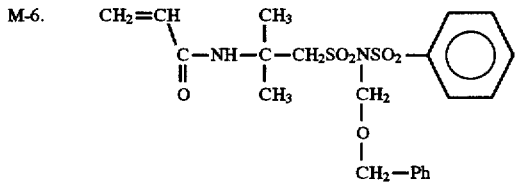
M-7.

-continued

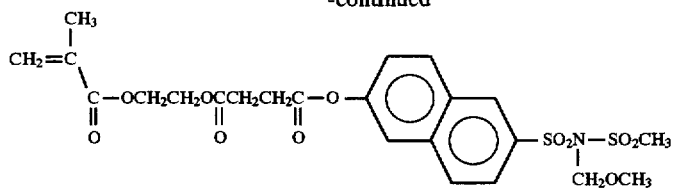
M-8.

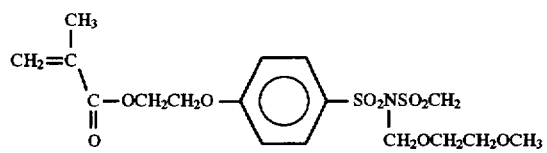
M-9.

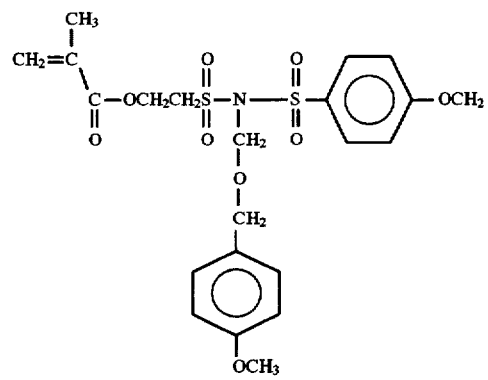
M-10.

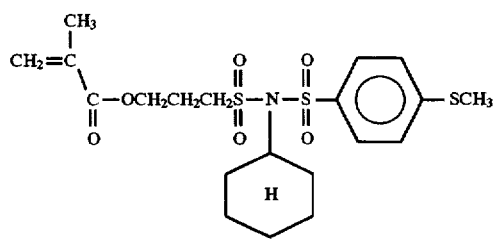
M-11.

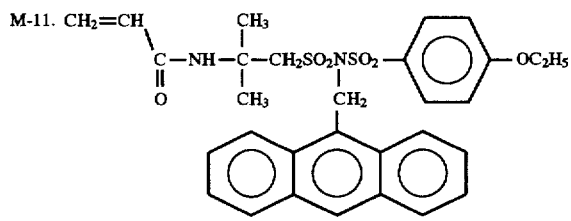
M-12.

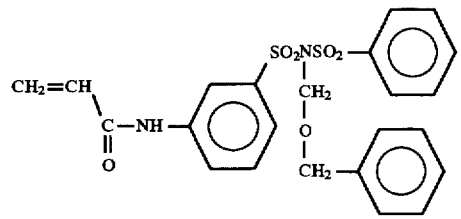
M-13.

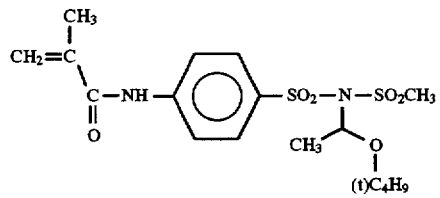
M-14.

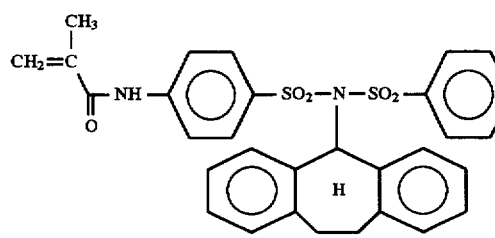
M-15.

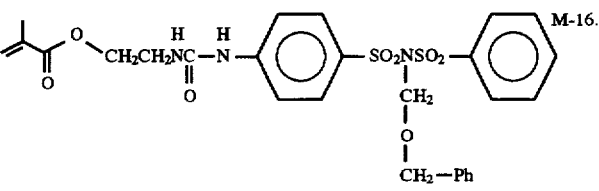
M-16.

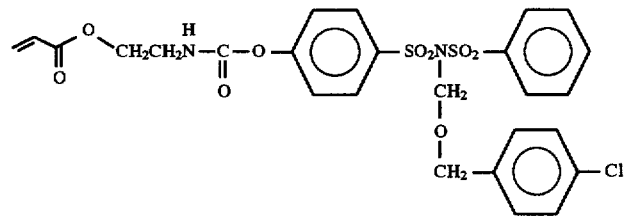
M-17.

Specific examples of a comonomer useful for copolymerization reaction with the sulfonimide monomer as recited above include acrylic acid or methacrylic acid; acrylic acid esters or methacrylic acid esters (e.g., methyl acrylate or methacrylate, ethyl acrylate or methacrylate, butyl acrylate or methacrylate, octyl acrylate or methacrylate, 2-dimethylaminoethyl acrylate or methacrylate, 2-methoxyethyl acrylate or methacrylate, 2-hydroxyethyl acrylate or methacrylate, 2-chloroethyl acrylate or methacrylate, benzyl acrylate or methacrylate, glycidyl acrylate or methacrylate, 2-cyanoethyl acrylate or methacrylate, 2-isocyanatoethyl acrylate or methacrylate, tetrahydrofurfuryl acrylate or methacrylate); acrylamide and derivatives thereof (e.g., N-methylolacrylamide, N-isobutoxymethylacrylamide, methacrylamide); trialkoxysilanes containing vinyl groups, such as methacryloyloxypropyltrimethoxysilane; styrene; maleic anhydride; 4-vinylpyridine; 2-methacryloyloxyethane-1-sulfonic acid and salts thereof; acrylonitrile; and vinyl ethers, such as ethyl vinyl ether. However, these examples are not to be considered as limiting on the scope of the invention. Other examples of an acrylic monomer and an acrylamide monomer are recited in *Encyclopedia of Polymer Science*, 2nd Ed., vol. 1, pp. 182, 204, 237, 242 and 243.

As another group of polymers which are useful because of their ease of syntheses and their excellent diversity, mention may be made of polyurethanes prepared from diols, diisocyanates and chain extenders. In the preparation of such polymers, particularly useful reactants are sulfonimide derivatives having dihydroxyl groups or diisocyanate groups. These dihydroxyl derivatives are used directly or after the conversion into diisocyanate prepolymers by the reaction with tolylene-2,4-diisocyanate. Other diols, such as terminal hydroxyl-containing straight-chain aliphatic polyesters and aliphatic polyethers, and other diisocyanates, such as aromatic, aliphatic, alicyclic or polycyclic diisocyanates, can be used in combination. Due to such diversity in selection of reactants, it is allowed to prepare polymers of a wide variety of molecular weight and desired physical properties. The arts, chemical properties, fundamental structures and synthesis paths of polyurethane elastomers are summarized in C. Hepburn, *Polyurethane Elastomers*, Applied Science Publishers, New York (1982), and *Encyclopedia of Polymer Chemical Industry*, 2nd. Ed., vol. 13, pp. 243–303.

Specific examples of a dihydroxyl-substituted sulfonimide suitable for the preparation of polyurethanes are illustrated below:

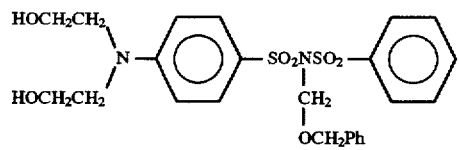

U-1.

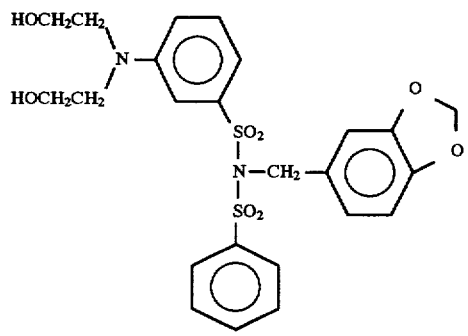

U-2.

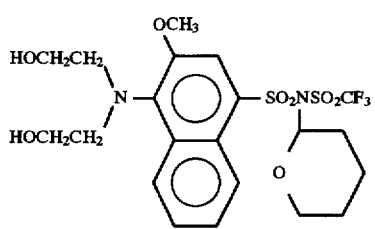

U-3.

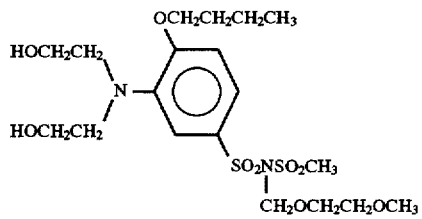

U-4.

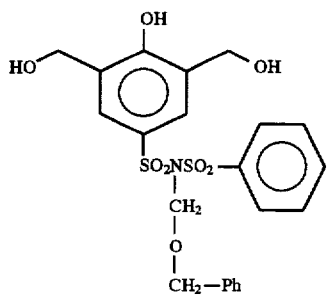

U-5.

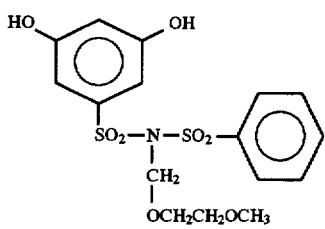

U-6.

However, the compounds illustrated above should not be considered as limiting on the scope of the dihydroxyl-substituted sulfonimide compounds suitable for the present invention.

The proportion of the total sulfonimide groups ($-SO_2NR^2SO_2R^1$) in the present polymer can be from 0.01 to 99% by weight. From the practical point of view, however, it is in the range of 0.1 to 98% by weight.

The weight average molecular weight of the present polymer is generally from about 1,000 to about 1,000,000, but can exceed such a limit. Preferably, the present polymer has its weight average molecular weight in the range of about 5,000 to about 1,000,000.

Specific examples of a polymer having constitutional units of formula (I') used in the present invention are illustrated below. However, the invention should not be construed as being limited to these examples. Additionally, the figures in the following structural formula are mole fractions.

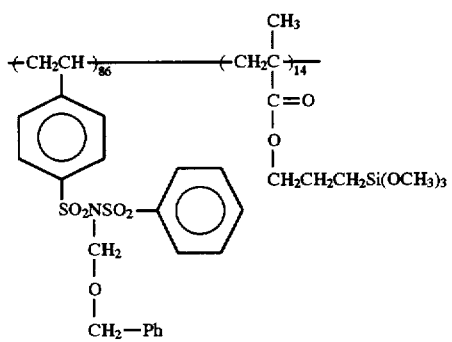
(P-1)
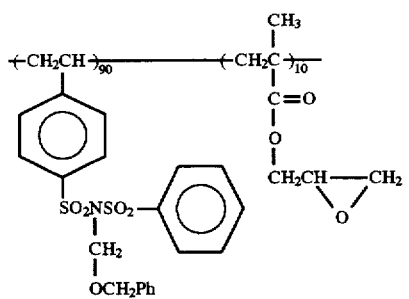
(P-2)
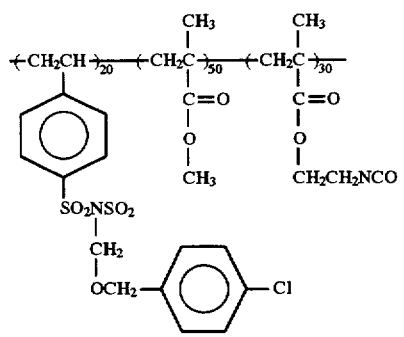
(P-3)
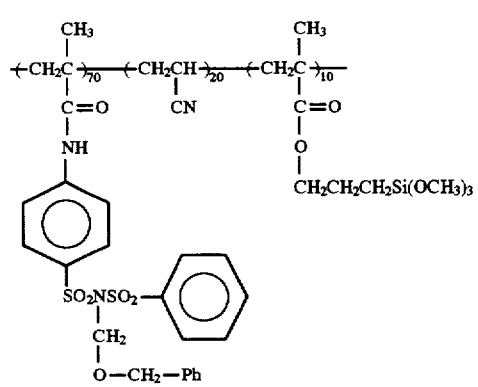
(P-4)
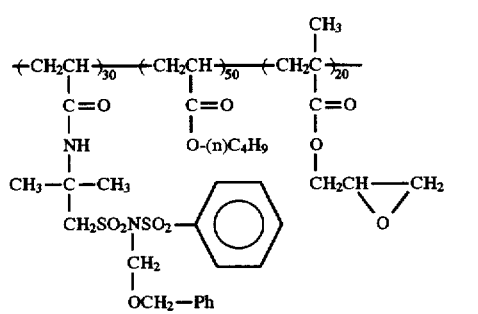
(P-5)

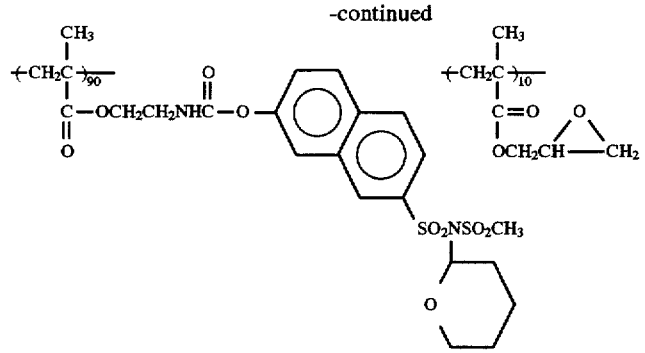
(P-6)
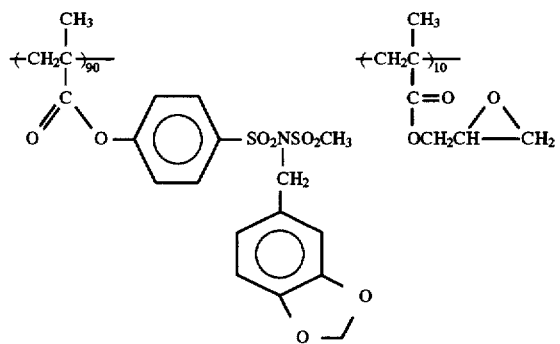
(P-7)
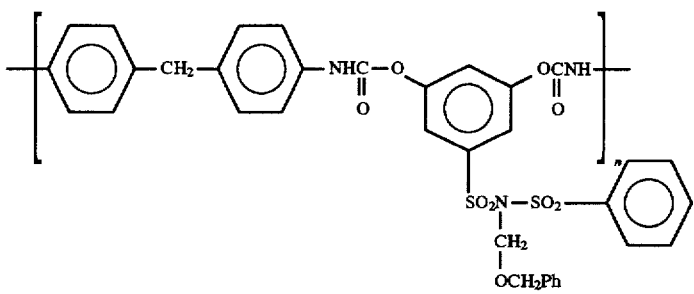
(P-8)
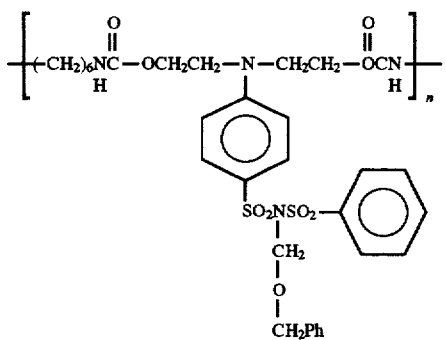
(P-9)
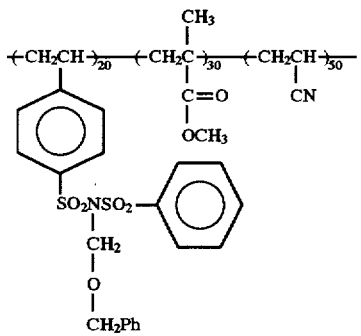
(P-10)

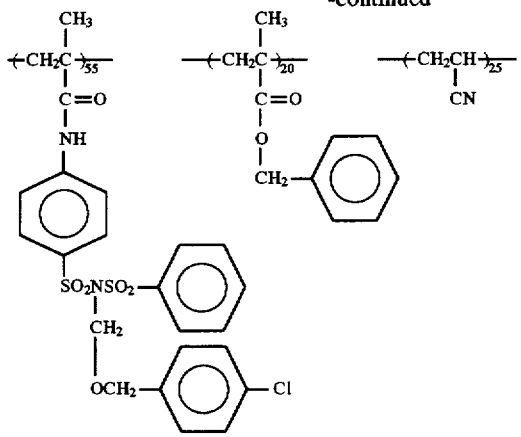

(P-11)

Synthesis Examples of polymers containing sulfonimide groups according to the present invention are described below.

Synthesis of Monomer (Exemplified Compound M-1)

In a 1-liter three necked flask were placed 36.6 g of p-vinylbenzenesulfonamide, 60.7 g of triethylamine, 2.4 g of dimethylaminopyridine and 200 ml of acetonitrile.

The flask was cooled in an ice bath, and 53.0 g of benzenesulfonyl chloride dissolved in 200 ml of acetonitrile was dropped thereinto over a one-hour period with stirring.

After the dropping, the stirring was continued for 3 hours at room temperature, and allowed to stand overnight.

Then, 37.6 g of chloromethyl benzyl ether was added to the reaction solution, and subjected to 5-hour stirring at room temperature. The resulting solution was poured into 800 ml of water, extracted with 500 ml of ethyl acetate, dried over magnesium sulfate, and then concentrated. The concentrate obtained was purified by chromatography on silica gel (using a 3:1, by volume, mixture of hexane and ethyl acetate). Thus, 20 g of white crystals, mp 93 –94° C., were obtained.

SYNTHESIS EXAMPLE 1

Synthesis of Polymer containing Sulfonimide Group (P-1)

In a 100-ml three necked flask, 10.0 g of Compound M-1, 1.0 g of methacryloxypropyltrimethoxysilane and 16 g of ethyl acetate were placed, and kept at 65° C. with stirring under a stream of nitrogen. Thereto, 6.8 mg of 2,2'-azobis (2,4-dimethylvaleronitrile) was added, and the stirring was continued. After a lapse of two hours, 17.0 mg of 2,2'-azobis (2,4-dimethylvaleronitrile) was further added, and subjected to 4-hour stirring. Then, the reaction solution was cooled to room temperature, and poured into 500 ml of methanol. A solid precipitate (polymer) was filtered off, and dried. The weight average molecular weight of the polymer determined by GPC was $4.2 \times 10^4$. Yield: 8.3 g.

SYNTHESIS EXAMPLE 2

Synthesis of Polymer containing Sulfonimide Groups (P-2)

In a 100-ml three necked flask, 10.0 g of Compound M-1, 0.43 g of glycidyl methacrylate and 16 g of ethyl acetate were placed, and kept at 65° C. with stirring under a stream of nitrogen. Thereto, 6.8 mg of 2,2'-azobis(2,4-dimethylvaleronitrile) was added, and the stirring was continued. After a lapse of two hours, 17.0 mg of 2,2'-azobis (2,4-dimethylvaleronitrile) was further added, and subjected to 4-hour stirring. Then, the reaction solution was cooled to room temperature, and poured into 500 ml of methanol. A solid precipitate (polymer) was filtered off, and dried. The weight average molecular weight of the polymer determined by GPC was $3.8 \times 10^4$. Yield: 8.0 g.

Each of those polymers having the structural units of formula (I') is used in a proportion of generally from 5 to 99 weight %, preferably from 10 to 99 weight %, more preferably from 15 to 98 weight %, to the total ingredients of the composition (excepting a coating solvent).

The photoacid generator (or the compound capable of decomposing by the action of light or heat to generate an acid) used in the present invention can be selected properly from among a photoinitiator for photo cationic polymerization, a photoinitiator for photo radical polymerization, a photodecolorizer for dyes, a photo discoloring agent, known photoacid generators used for microresist and the like, and a mixture of two or more of the above agents.

As examples of compounds used as those agents, mention may be made of the diazonium salts described, e.g., in S. I. Schlesinger, Photogr. Sci. Eng., 18, 387 (1974), and T. S. Bal et al., Polymer, 21,423 (1980); onium salts, such as the ammonium salts described, e.g., in U.S. Pat. Nos. 4,069,055, 4,069,056 and Re Pat. No. 27,992, and JP-A-4-365049, the phosphonium salts described, e.g., in D. C. Necker et al., Macromolecules, 17, 2468 (1984), C. S. Wen et al., Tech. Proc. Conf. Rad. Curing ASIA, p. 478, Tokyo (October, 1988), and U.S. Pat. No. 4,069,055 and 4,069,056, the iodonium salts described, e.g., in J. V. Crivello et al., Macromolecules, 10(6), 1307 (1977), Chem. & Eng. News, Nov. 28, p. 31 (1988), European Patent 0,104,143, U.S. Pat. Nos. 339,049 and 410,210, JP-A-2-150848 and JP-A-2-296514, the sulfonium salts described, e.g., in J. V. Crivello et al., Polymer J., 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14(5), 1141 (1981), J. V. Crivello et al., J. Polymer Sci., Polymer Chem. Ed., 17, 2877 (1979), European Patents Nos. 0,370,693, 0,233,567, 0,297,443 and 0,297,422, U.S. Pat. Nos. 4,933,377, 4,837,124, 4,760,013, 4,734,444 and 2,833,827, and German Patents 2,904,626, 3,604,580 and 3,604,581, the selenonium salts described, e.g., in J. V. Crivello et al., Macromolecules, 10(6), 1307 (1977), and J. V. Crivello et al., J. Polymer Sci., Polymer Chem. Ed., 17, 1047 (1979), and the arsonium salts described, e.g., in C. S. Wen et al., Teh. Proc. Conf. Rad. Curing ASIA, p. 478, Tokyo (October, 1988); the organic halogeno-compounds described, e.g., in U.S. Pat. No. 3,905, 815, JP-B-46-4605 (The term "JP-B" as used herein means an "examined Japanese patent publication"), JP-A-48-

36281, JP-A-55-32070, JP-A-60-239736, JP-A-61-169835, JP-A-61-169837, JP-A-62-58241, JP-A-62-212401, JP-A-63-70243 and JP-A-63-298339; the organometallic compounds/organic halides described, e.g., in K. Meier et al., *J. Rad. Curing*, 13(4), 26 (1986), T. P. Gill et al., *Inorg. Chem.*, 19, 3007 (1980), D. Astruc, *Acc. Chem. Res.*, 19(12), 377 (1896), and JP-A-2-161445; the photoacid generators having protective groups of o-nitrobenzyl type as described, e.g., in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24), 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11(4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130(6), F. M. Houlihan et al., *Macromolecules*, 21, 2001 (1988), European Patent Nos. 0,290,750, 0,046, 083, 0,156,535, 0,271,851 and 0,388,343, U.S. Pat. Nos. 3,901,710 and 4,181,531, JP-A-60-198538 and JP-A-53-133022; compounds generating sulfonic acid by photolysis, representatives of which are the iminosulfonates described, e.g., in M. Tunooka et al., *Polymer Preprints Japan*, 35(8), G. Berner et al., *J. Rad. Curing*, 13(4), W. J. Mijs et al., *Coating Technol.*, 55(697), 45 (1983), Akzo, H. Adachi et al., *Polymer Preprints Japan*, 37(3), European Patent Nos. 0,199,672, 0,084,515, 0,199,672, 0,044,115 and 0,101,122, U.S. Pat. Nos. 4,618,564, 4,371,605 and 4,431,774, JP-A-64-18143, JP-A-2-245756 and JP-A-4-365048; and the disulfone compounds described, e.g., in JP-A-61-166544.

In addition, polymers into the main chain or side chains of which those groups or compounds capable of generating acids under light are introduced, such as the compounds described, e.g., in M. E. Woodhouse et al., *J. Am. Chem. Soc.*, 104, 5586 (1982), S. P. Pappas et al., *Imaging Sci.*, 30(5), 218 (1986), S. Kondo et al., *Makromol. Chem.*, Rapid Commun., 9, 625 (1988), Y. Yamada et al., *Makromol. Chem.*, 152, 153, 163 (1972), J. V. Crivello et al., *J. Polymer Sci.*, Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, Jp-A-63-163452, JP-A-62-153853 and JP-A-63-146029, can also be employed.

Further, the compounds capable of generating acids under light described, e.g., in V. N. R. Pillai, *Synthesis*, (1), 1 (1980), A. Abad et al., *Tetrahedron Lett.*, (47) 4555 (1971), D. H. R. Barton et al., *J. Chem. Soc., (C)*, 329 (1970), U.S. Pat. No. 3,779,778 and European Patent No. 0,126,712, can be employed, too.

Of the aforementioned compounds to generate acids due to the action of light or heat, especially effective ones are described below:

(1) An oxazole compound substituted by a trihalomethyl group which is represented by the following formula (PAG1), and an s-triazine compound substituted by trihalomethyl groups which is represented by the following formula (PAG2);

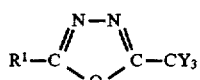

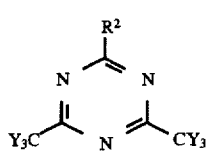

wherein $R^1$ is a substituted or unsubstituted aryl or alkenyl group, $R^2$ is a substituted or unsubstituted aryl, alkenyl or alkyl group or —$CY_3$, and Y is a chlorine or bromine atom.

Specific examples of such compounds are illustrated below, but these examples should not be construed as limiting the scope of the present invention.

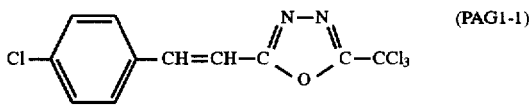

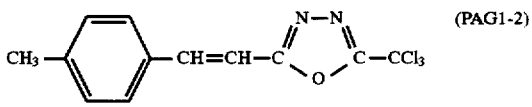

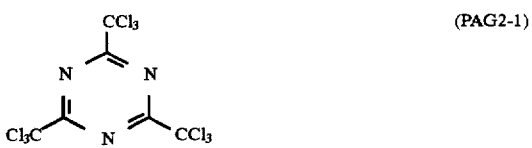

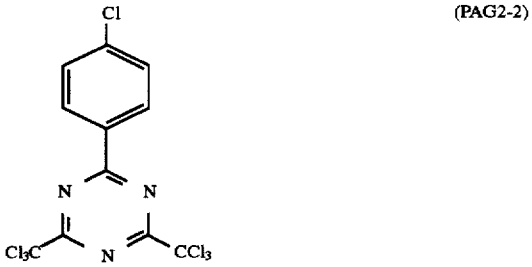

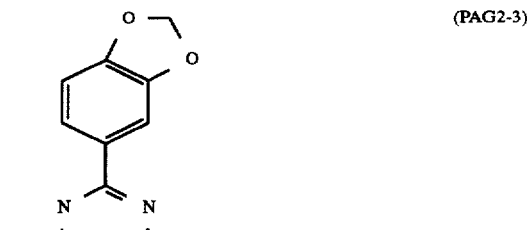

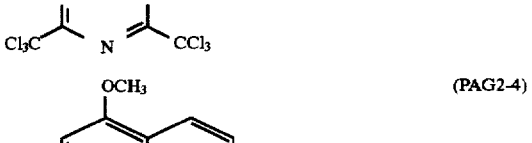

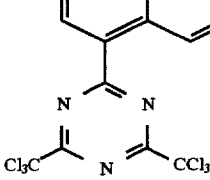

-continued (PAG2-5)

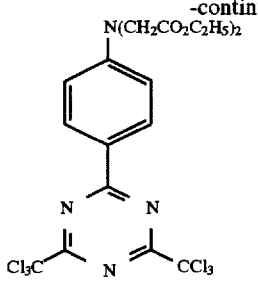

(2) An iodonium salt represented by the following formula (PAG3), a sulfonium salt represented by the following formula (PAG4), or diazonium salts:

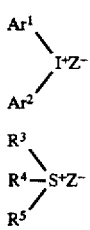 (PAG3)

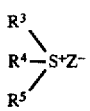 (PAG4)

wherein $Ar^1$ and $Ar^2$ are each a substituted or unsubstituted aryl group (suitable examples of substituent(s) the aryl group can have include an alkyl group, a haloalkyl group, a cycloalkyl group, an aryl group, an alkoxy group, a nitro group, a carboxyl group, an alkoxycarbonyl group, a hydroxyl group, a mercapto group and a halogen atom); $R^3$, $R^4$ and $R^5$ are each a substituted or unsubstituted alkyl or aryl group, preferably an aryl group containing 6 to 14 carbon atoms, an alkyl group containing 1 to 8 carbon atoms or substituted groups thereof (examples of substituents suitable for the aryl group are 1-8C alkoxy, 1-8C alkyl, nitro, carboxyl, hydroxy and halogen, and those for the alkyl group are 1-8C alkoxy, carboxyl and alkoxycarbonyl); $Z^-$ is a counter anion, such as $BF_4^-$, $AsF_6^-$, $PF_6^-$, $SbF_6^-$, $SiF_6^-$, $ClO_4^-$, a perfluoroalkanesulfonic acid anion such as $CF_3SO_3^-$, a pentafluorobenzenesulfonic acid anion, a condensed polynuclear aromatic sulfonic acid anion such as naphthalene- 1-sulfonic acid anion, an anthraquinonesulfonic acid anion or a dye containing sulfonic acid group; and wherein two among $R^3$, $R^4$ and $R^5$, and $Ar^1$ and $Ar^2$ may combine with each other via a single bond or a substituent.

Specific examples of such compounds are illustrated below, but these examples should not be construed as limiting the scope of the present invention.

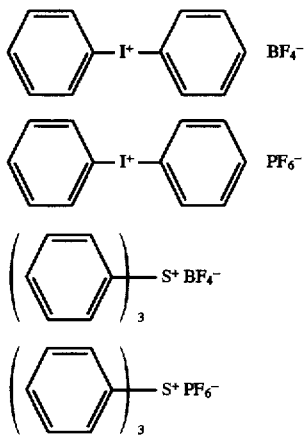

(PAG3-1)

(PAG3-2)

(PAG4-1)

(PAG4-2)

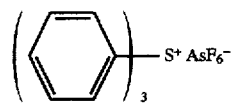 (PAG4-3)

The foregoing onium salts of formulae (PAG3) and (PAG4) are known compounds, and can be prepared using the methods described, e.g., in J. W. Knapczyk et al., *J. Am. Chem. Soc.*, 91, 145 (1969), A. L. Maycol et al., *J. Org. Chem.*, 35, 2532 (1970), E. Goethas et al., *Bull. Soc. Chem. Belg.*, 73, 546 (1964), H. M. Leicester, *J. Am. Chem. Soc.*, 51, 3587 (1929), J. V. Crivello et al., *J. Polymer Sci., Polymer Chem. Ed.*, 18, 2677 (1980), U.S. Pat. Nos. 2,807, 648 and 4,247,473, and JP-A-53-101331.

(3) A disulfone compound represented by the following formula (PAG5) and an iminosulfonate compound represented by the following formula (PAG6):

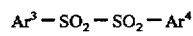 (PAG5)

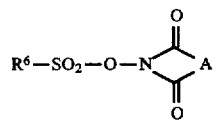 (PAG6)

wherein $Ar^3$ and $Ar^4$ are each a substituted or unsubstituted aryl group, $R^6$ is a substituted or unsubstituted alkyl or aryl group, and A is a substituted or unsubstituted alkylene, alkenylene or arylene group.

Specific examples of such compounds are illustrated below, but these examples should not be construed as limiting the scope of the present invention.

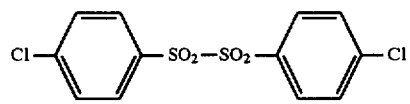 (PAG5-1)

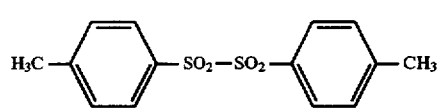 (PAG5-2)

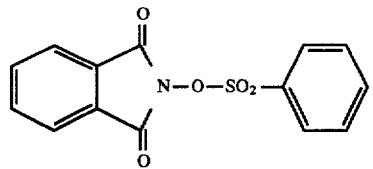 (PAG6-1)

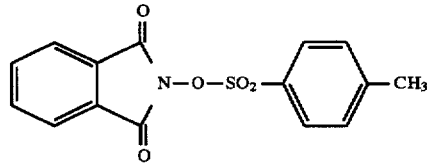 (PAG6-2)

These compounds to generate acids by the action of light or heat are used in a proportion of generally from 0.001 to 40 weight %, preferably from 0.01 to 20 weight %, more preferably from 0.1 to 5 weight %, to the total ingredients of the composition (except a coating solvent).

Further, the spectral sensitizers as recited below are added to induce sensitivity to the wavelengths at which the photoacid generator used has no spectral absorption, that is, wavelengths longer than the deep ultraviolet region, and thereby it becomes possible to confer the sensitivity to i- or g-line upon the present composition. Suitable examples of such a spectral sensitizer include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, Acridine Orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin), and coronene. However, suitable spectral sensitizers should not be construed as being limited to these examples.

In order to induce the sensitivity in the visible region, known spectral sensitizers, such as cyanine dyes, merocyanine dyes, squarylium dyes, coumarin dyes, xanthene dyes, Julolidine dyes, pyrylium dyes, acridine dyes, Michler's ketone, thioxanthone and acridone, can be employed.

Besides those spectral sensitizers, dyes showing spectral absorption in the infrared region are especially advantageous to the preparation of photosensitive compositions for the infrared-sensitive lithographic printing plates because they enables the acid generation under infrared radiation when they are used in combination with the foregoing photoacid generators.

The infrared absorbing dyes used for the aforesaid purpose are dyes or pigments which can effectively absorb infrared radiation in the wavelength region of 760 to 1,200 nm. Preferably, the dyes or pigments showing their absorption maxima in the wavelength region of 760 to 1,200 nm are employed.

As those dyes, the commercially available dyes and known dyes described in literature (e.g., *Senryo Binran* (which means "Handbook of Dyes"), compiled by Yuki Gosei Kagaku Kyokai in 1970) can be used. Specifically, such dyes include azo dyes, metal complex azo dyes, pyrazolone azo dyes, anthraquinone dyes, phthalocyanine dyes, carbonium dyes, quinoneimine dyes, methine dyes, cyanine dyes and metal thiolate complexes.

As suitable examples of such dyes, mention may be made of the cyanine dyes described, e.g., in JP-A-58-125246, JP-A-59-84356, JP-A-59-202829 and JP-A-60-78787, the methine dyes described, e.g., in JP-A-58-173696, JP-A-58-181690 and JP-A-58-194595, the naphthoquinone dyes described, e.g., in JP-A-58-112793, JP-A-58-224793, JP-A-59-48187, JP-A-59-73996, JP-A-60-52940 and JP-A-60-63744, the squarylium dyes described, e.g., described in JP-A-58-112792, and the cyanine dyes described in British Patent 434,875.

Also, the sensitizers of the type which can absorb near infrared radiation, such as those described in U.S. Pat. No. 5,156,938, are appropriately employed. Further, the substituted arylbenzo(thio)pirylium salts described in U.S. Pat. No. 3,881,924, the trimethinethiapyrylium salts described in JP-A-57-142645 (corresponding to U.S. Pat. No. 4,327, 169), the pyrylium compounds described in JP-A-58-181051, JP-A-58-220143, JP-A-59-41363, JP-A-59-84248, JP-A-59-84249, JP-A-59-146063 and JP-A-59-146061, the cyanine dyes described in JP-A-59-216146, the pentamethinethiopyrylium salts described in U.S. Pat. No. 4,283, 475 and the pyrylium compounds disclosed in JP-B-05-13514 and JP-B-05-19702 are suitably used, too.

As still other examples of appropriate dyes, mention may be made of the near infrared absorbing dyes represented by formulae (I) and (II) in U.S. Pat. No. 4,756,993.

Of such dyes, the cyanine dyes, the squarylium dyes, the pyrylium salts and nickel-thiolate complexes are preferred in particular.

In addition, dyes used appropriately include oil colors and basic dyes. Specifically, Oil Yellow #101, Oil Yellow #103, Oil Pink #312, Oil Green BG, Oil Blue BOS, Oil Blue #603, Oil Black BY, Oil Black BS, Oil Black T-505 (which are products of Orient Kagaku Kogyo Co., Ltd.), Crystal Violet (CI42555), Methyl Violet (CI42535), Rhodamine B (CI45170B), Malachite Green (CI42000) and Methylene Blue (CI52015) are examples thereof.

The pigments usable in the present invention include commercially available pigments and the pigments described in *Color Index (C.I.) Handbook, Saishin Ganryo Binran* (which means "The Newest Handbook of Pigments"), compiled by Nippon Ganryo Gijutsu Kyokai in 1977, *Saishin Ganryo Oyo Gijutsu* (which means "The Newest Arts of Pigment Application"), published by CMC Shuppan in 1986, and *Insatsu Ink Gijutsu* (which means "Arts of Printing Ink"), published by CMC Shuppan in 1984.

As for the kinds of usable pigments, black pigments, yellow pigments, orange pigments, brown pigments, red pigments, violet pigments, blue pigments, green pigments, fluorescent pigments, metallic powder pigments and polymer-attached dyes are examples thereof. Specifically, insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments and carbon black can be used. Of these pigments, carbon black is preferred over the others.

Those pigments may be used without receiving a surface treatment or after they have undergone a surface treatment. As examples of a method for a surface treatment, mention may be made of the method of coating a pigment surface with a resin or wax, the method of making a surfactant adhere to a pigment surface and the method of binding a reactive substance (e.g., a silane coupling agent, an epoxy compound or a polyisocyanate) to a pigment surface. Such surface treatment methods are described, e.g., in *Kinzoku Sekken no Seishitsu to Oyo* (which means "Properties and Applications of Metallic Soap"), published by Saiwai Shobo, *Insatsu ink Gijutsu* (which means "Arts of Printing Ink"), published by CMC Shuppan in 1984, and *Saishin Ganryo Oyo Gijutsu* (which means "The Newest Arts of Pigment Application"), published by CMC Shuppan in 1986.

The particle size of a pigment is desirably from 0.01 to 10 µm, more desirably from 0.05 to 1 µm, and particularly desirably from 0.1 to 1 µm. When the particle size of a pigment is below 0.01 µm, the dispersion of such a pigment is undesirable in respect of the stability in a coating solution for forming a photosensitive layer; while, when the particle size of a pigment is above 10 µm, such a pigment has an undesirable influence upon the uniformity of an image recording layer.

As a method of dispersing pigments, known dispersion arts used for the production of ink and toner can be employed. Specific examples of a dispersing machine include an ultrasonic disperser, a sand mill, an attriter, a pearl mill, a super mill, a ball mill, an impeller, a disperser, a KD mill, a colloid mill, a dynatron, a three-rod roll mill and a pressure kneader. For details thereof *Saishin Ganryo*

*Oyo Gijutsu* (which means "The Newest Arts of Pigment Application"), published by CMC Shuppan in 1986, can be referred to.

Those dyes or pigments are used in a proportion of from 0.01 to 50 weight %, preferably from 0.1 to 10 weight %, to the total solids in the composition. As for the proportion of dyes added, the range of 0.5 to 10 weight % is particularly preferred; while the range of 3.1 to 10 weight % is particularly preferred as the proportion of pigments added. When the proportion of pigments or dyes added is below 0.01 weight %, the resultant composition is low in sensitivity; while the addition thereof in a proportion greater than 50 weight % causes scum in a non-image area upon printing.

The dyes or pigments as recited above may be incorporated together with other ingredients in the same layer, or they may be incorporated in a layer provided independently of the layer containing other ingredients.

The present composition can comprise a high molecular organic binder insoluble in water but soluble or at least swelling in an aqueous alkali solution (which is also called an alkali-soluble resin). Specific examples of such an alkali-soluble resin include a novolak resin, a hydrogenated novolak resin, an acetone-pyrogallol resin, a poly (hydroxystyrene), a halogen- or alkyl-substituted poly (hydroxystyrene), a hydroxystyrene-N-substituted maleimide copolymer, a partially O-alkylated or O-acylated poly (hydroxystyrene), a styrene-maleic anhydride copolymer, and a carboxyl-containing methacrylic resin and derivatives thereof. However, these examples should not be construed as limiting the scope of the invention.

Of those alkali-soluble resins, a novolak resin and a poly(hydroxystyrene) are preferred over the others. The novolak resin can be obtained using specified monomers as main component and subjecting them to the addition condensation reaction with aldehydes in the presence of an acidic catalyst.

As for the specified monomers, aromatic hydroxy compounds, such as phenol, cresols (e.g., m-cresol, p-cresol and o-cresol), xylenols (e.g., 2,5-xylenol, 3,5-xylenol, 3,4-xylenol and 2,3-xylenol), alkylphenols (e.g., m-ethylphenol, p-ethylphenol, o-ethylphenol, p-t-butylphenol, p-octylphenol and 2,3,5-trimethylphenol), alkoxyphenols (e.g., p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol), -alkylphenols (e.g., 2-methyl-4-isopropylphenol), m-chlorophenol, p-chlorophenol, o-chlorophenol, dihydroxybiphenyl, bisphenol A, phenylphenol, resorcinol and naphthol, can be employed alone or as a mixture of two or more thereof. However, these examples should not be considered as limiting the scope of the invention.

Specific examples of aldehydes which can be used include formaldehyde, paraformaldehyde, acetaldehyde, propyl aldehyde, benzaldehyde, phenylacetaldehyde, α-phenylpropyl aldehyde, β-phenylpropyl aidehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde and acetal compounds thereof, such as chloroacetaldehyde diethylacetal. Of these aldehydes, formaldehyde is used to particular advantage.

Those aldehydes can be used alone or as a mixture of two or more thereof. As for the acidic catalyst which can be used, hydrochloric acid, sulfuric acid, formic acid, acetic acid and oxalic acid are examples thereof.

It is desirable for the novolak resins obtained in the foregoing manner to have their weight average molecular weight in the range of 1,000 to 30,000. When the weight average molecular weight is below 1,000, a decrease of film thickness due to development is too great in the unexposed area; while, when it is increased beyond 30,000, the development speed becomes low. In particular, the range of 2,000 to 20,000 is desirable for the weight average molecular weight of a novolak resin used.

Additionally, the weight average molecular weight is defined as the value determined by gel permeation chromatography on a polystyrene basis.

The alkali-soluble resins as recited above may be used as a mixture of two or more thereof. They are used in a proportion of from 0 to 97 weight %, preferably from 60 to 90 weight %, to the total ingredients of the photosensitive composition (except a coating solvent).

The present sulfonimide compounds used as dissolution inhibitor can be used together with known dissolution inhibitors.

More specifically, besides the present acid-cleavable sulfonamide compounds, the compounds having other linkages capable of being cleaved by an acid, such as C—O—C and C—O—Si linkages, may be used in combination.

As for conventional compounds having acid-cleavable C—O—C or C—O—Si linkages, compounds of the following types (a) to (i) are known to be effective:

(a) compounds which each contain at least one orthocarboxylic acid ester and/or carboxylic acid amide acetal group and have polymerizability to form polymers containing those groups as cross-linking elements in their main chain or as substituents in their side chains, (b) olygomeric or polymeric compounds which each contain repeated acetal and/or ketal groups in the main chain, (c) compounds which each contain at least one enol ether or N-acylaminocarbonate group, (d) cyclic acetals or ketals of β-ketoesters or β-ketoamides, (e) compounds containing silyl ether groups, (f) compounds containing silyl enol ether groups, (g) monoacetal or monoketal compounds having an acetal or ketone component whose solubility is from 0.1 to 100 g/l in a developer, (h) tertiary alcohol ethers, and (i) carboxylic acid esters or carbonates of tertiary allylic or benzyl alcohols.

As the acid-cleavable component of a radiation responsive mixture, the compounds of type (a) are described in German Patent Application (OLS) Nos. 2,610,842 and 2,928,636. The mixtures containing the compounds of type (b) are described in German Patent 2,306,248 and 2,718, 254. The compounds of type (c) are described in EP-A-0006626 and EP-A-0006627, the compounds of type (d) in EP-A-0202196, the compounds of type (e) in German Patent Application (OLS) Nos. 3,554,165 and 3,601,264, the compounds of type (f) in German Patent Application (OLS) Nos. 3,730,785 and 3,730,783, and the compounds of type (g) in German Patent Application (OLS) No. 3,730,785. The compounds of type (h) are described, e.g., in U.S. Pat. No. 4,603,101, and the compounds of type (i) are described, e.g., in U.S. Pat. No. 4,491,628 and J. M. Frechet et al., *J. Imaging Sci.*, vol. 30, pp. 59–64(1986).

Also, the acid-cleavable compounds as described above can be used as a mixture of two or more thereof. Of the foregoing compounds of types (a) to (i), the compounds of the types (a), (b), (g) and (i) are preferred over the others. Of the compounds of type (b), polymerizing acetals are particularly noteworthy. Of the acid-cleavable compounds of type (g), the compounds having an acetal or ketone component whose boiling point is higher than 150° C., preferably higher than 200° C. are worthy of remark. As other suitable examples of an acid-cleavable substance, mention may be made of organic polymers containing C—O—C or C—O—Si linkages. More specifically, those polymers include organic polymers containing acid-decomposable ether, ester, carbonate, acetal, ketal or silylether linkages. Specific examples of such polymers are described, e.g., in EP-A-0520265, U.S. Pat. No. 4,985,332, West German Patent Nos. 2,718,254 and 3,601,264, and U.S. Pat. No. 4,931,379.

The compounds containing acid-clearable C—O—C or C—O—Si linkages are used in a proportion of 0 to 50 weight %, preferably 0 to 20 weight %, to the total ingredients of the photosensitive composition (excepting a solvent). When the compounds containing acid-cleavable C—O—C or C—O—Si linkages are polymers, they can be used in place of a part or all of the foregoing alkali-soluble resins.

Further, the present composition can optionally contain other dyes and pigments, a plasticizer, a surfactant, a photosensitizer and a compound having at least two phenolic OH groups which can promote the dissolution into a developer.

When the present composition is used in a coated state, a plate-form material having high dimensional stability is used as a support to be coated with the composition. Specific examples of such a support include paper, papers laminated with plastics (e.g., polyethylene, polypropylene, polystyrene), plates of metals (e.g., aluminum (including aluminum alloys), zinc, copper), plastic films (e.g., films of cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and papers or plastic films having thereon laminated or deposited films of metals as cited above. Of these supports, an aluminum plate is used to particular advantage in making a presensitized lithographic plate, because it is very high in dimensional stability, and cheap as well. In addition, a complex sheet having an aluminum sheet on a polyethylene terephthalate film in a bonded state is also favorable.

As for the support having a metal surface, especially an aluminum surface, it is desirable that the support be subjected to a surface treatment, such-as a graining treatment, a dipping treatment in an aqueous solution of sodium silicate, potassium fluorozirconate, a phosphate, etc., an anodic oxidation treatment or so on. As other suitable supports, all materials for constituting or producing a capacitor, a semiconductor, a multi-layer printed circuit or an integrated circuit can be employed. In particular, a thermally oxidized silicon material and/or an optionally doped aluminum-coated silicon material, and other substrates generally used in semiconductor arts, such as silicon nitride, gallium arsenide and indium phosphide, are used to advantage. In addition, substrates known in the arts of producing liquid crystal displays, such as glass and indium tin oxide, plates and foils of metals (e.g., aluminum, copper, zinc), double and triple metal foils, metal-deposited nonconductive sheets, optionally aluminum-coated SiO₂ materials, and paper are well suited for a support material. Those support materials may be subjected to a thermal pretreatment, a surface roughening treatment, an initial etching treatment or a chemical treatment to undergo improvements in desired characteristics, e.g., enhancement of water wettability.

The present composition prepared by dissolving the aforementioned ingredients in a proper solvent is coated on a support as recited above. Specific examples of such a solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethylacetate, ethylene glycol monoethylether acetate, propylene glycol monomethyl ether, propylene glycol monomethylether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. These solvents are used alone or as a mixture of two or more thereof. The concentration of the aforementioned ingredients (the total solids, including additives) in such a solvent is preferably adjusted to from 2 to 50 weight %.

Also, a surfactant can be added to such a solvent. Specific examples of such a surfactant include nonionic surfactants, such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl aryl ethers (e.g., polyoxyethylene octyl phenyl ether, polyoxyethylene nonyl phenyl ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylenesorbitan fatty acid esters (e.g., polyoxyethylenesorbitan monolaurate, polyoxyethylenesorbitan monopalmitate, polyoxyethylenesorbitan monostearate, polyoxyethylenesorbitan trioleate, polyoxyethylenesorbitan tristearate), fluorine-containing surfactants, such as Eftop EF301, EF303 and EF352 (commercial names, products of Shin-Akita Kasei K.K.), Megafac F171, F173 and F177 (commercial names, products of Dainippon Ink & Chemicals, Inc.), Florad FC430 and FC431 (commercial names, products of Sumitomo 3M Co., Ltd.), Asahi Guard AG710, Surflon S-382, SC101, SC102, SC103, SC104, SC105 and SC106 (commercial names, products of Asahi Glass Company, Ltd.), organosiloxane polymers, such as KP341 (code name of Shin-etsu Chemical Industry Co., Ltd.), and acrylic or methacrylic acid polymers, such as Polyflow No. 75 and No. 95 (commercial names, products of Kyoeisha Yushi Kagaku Kogyo K.K.). The amount of those surfactants added is generally not greater than 2 parts by weight, preferably not greater than 1 part by weight, per 100 parts by weight of the total solids in the present composition. Those surfactants may be added alone or as a mixture of two or more thereof.

The developer used for the present composition is an alkaline aqueous solution containing an inorganic alkali such as sodium hydroxide, potassium hydroxide, sodium carbonate, sodium hydrogen carbonate, sodium silicate, potassium silicate, sodium metasilicate, sodium tertiary phosphate, sodium secondary phosphate, ammonium tertiary phosphate, ammonium secondary phosphate or aqueous ammonia, a primary amine such as ethylamine or n-propylamine, a secondary amine such as diethylamine or di-n-butylamine, a tertiary amine such as triethylamine or methyldiethylamine, an alcohol amine such as dimethylethanolamine or triethanolamine, a quaternary ammonium slat such as tetramethylammonium hydroxide or tetraethylammonium hydroxide, or a cyclic amine such as pyrrole or piperidine. To such an alkaline aqueous solution, an alcohol such as benzyl alcohol and a surfactant can be added in appropriate amounts.

As examples of a light source of active beams used for the exposure of the present photosensitive composition, mention may be made of an ultra-high pressure, medium or low pressure mercury lamp, a metal halide lamp, a xenon lamp, a chemical lamp, a carbon arc lamp, various laser devices for visible, ultraviolet and other rays, a fluorescent lamp, a tungsten lamp and sun light are examples thereof. As for the radiations, electron beams, X-rays, ion beams and far ultraviolet rays are examples thereof. As a light source for photoresists, g-ray, i-ray and Deep-UV light are preferably used. Further, scanning or pulse exposure using high density energy beams (laser beams or electron beams) can also be employed for the exposure of the present composition. As for laser beams used for such exposure, He—Ne laser, argon laser, krypton ion laser, He—Cd laser and KrF excimer laser are examples thereof. For infrared radiation, on the other hand, solid laser or semiconductor laser devices capable of emitting infrared rays, particularly in the wavelength region of 760 to 1,200 nm.

Now, the present invention will be illustrated in more detail by reference to the following examples. However, the invention should not be construed as being limited to these examples. Unless otherwise noted therein, all % are by weight.

Examples 1 to 4 and Comparative Examples 1 to 4

The surface of a 0.30 mm-thick aluminum plate was grained with a nylon brush and a water suspension of pumice stone of 400 mesh, and thoroughly washed with water. Then, the aluminum plate was etched by being dipped for 60 seconds in a 10% sodium hydroxide solution kept at 70° C., followed by washing with running water. Further, the aluminum plate was washed with 20% $HNO_3$ for neutralization, followed by washing with water. Furthermore, the electrolytic surface-roughening treatment of the aluminum plate was carried out in a 1% water solution of nitric acid by furnishing anode electricity in a quantity of 160 coulomb/$dm^2$ using a sinusoidal alternating waveform current under $V_A$=12.7 V. The thus treated aluminum plate had the surface roughness of 0.6μ (expressed in terms of Ra). Subsequently, the aluminum plate was desmutted by being dipped for 2 minutes in a 30% water solution of sulfuric acid kept at 55° C., and further anodized in a 20% water solution of sulfuric acid under the electric current density of 2 A/$dm^2$ so as to have a thickness of 2.7 g/$m^2$. On the thus prepared aluminum plate, each of the following photosensitive solutions was coated by means of a whirler, and dried for 2 minutes at 100° C.

| Composition of Photosensitive Solution: | |
|---|---|
| Sulfonimide compound in Table 1 | 0.7 g |
| m/p-Cresol resin (m/p ratio: 6/4) | 2.0 g |
| 4-p-Tolylmercapto-2,5-diethoxybenzenediazonium hexafluorophosphate | 0.5 g |
| Crystal Violet | 0.01 g |
| Methyl ethyl ketone | 18 g |
| 2-Methoxyethanol | 6 g |

The dry coverage of each photosensitive solution was 2.1 g/$m^2$. The thus obtained presensitized plates were each exposed to light for 1 minutes using a metal halide lamp through a step tablet, Fuji Step Guide (made by Fuji Photo Film Co., Ltd., having 15 steps, an initial-step optical reflection density of 0.05 and an increase of 0.15 in optical reflection density every one-step increase). Each of the exposed plates was developed by one-minute dip in a 4% water solution of sodium metasilicate. The thus processed plate was examined by visual observation as to whether or not the photosensitive layer thereof was eluted in the exposed area to form an image (image formability). In addition, the sensitivity was evaluated by the number of steps present in the image formed. The greater number of steps in an image obtained is an indication of the higher sensitivity. The results obtained are shown in Table 1. It can be seen from the results shown in Table 1 that the combinations of the present acid-decomposable compounds with a novolak resin afforded excellent positive-image formability and high sensitivity.

TABLE 1

|  | Sulfonimide Compound | Image Formability | Sensitivity |
|---|---|---|---|
| Example 1 | Compound 1 | clear image | 8 |
| Example 2 | Compound 2 | clear image | 7 |
| Example 3 | Compound 12 | clear image | 6 |
| Example 4 | Compound 14 | clear image | 9 |
| Comparative Example 1 | absent | no image (dissolved completely) | — |
| Comparative Example 2 | Compound A | no image (remaining entirely) | — |
| Comparative Example 3 | Compound B | no image (remaining entirely) | — |
| Comparative Example 4* | absent | clear image | 5 |

*Standard positive printing plate, VPS (made by Fuji Photo Film Co., Ltd.)

Compound A

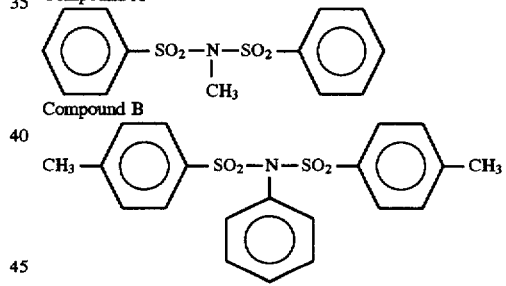

(Compound described in JP-A-7-28245)

Examples 5 to 9

A 0.03 mm-thick aluminum plate (quality: 1050) was degreased with trichloroethylene, and the surface thereof was grained with a nylon brush and a water suspension of pumice stone of 400 mesh, and thoroughly washed with water. Then, the aluminum plate was etched by 9-second dipping in a 25% sodium hydroxide solution kept at 45° C. followed by washing with water. Further, the plate was dipped for 20 seconds in 2% $HNO_3$, and then washed with water. The thus etched amount at the grained surface was about 3 g/$m^2$. Furthermore, this plate was provided with 3 g/$m^2$ of an anodized film by using 7% sulfuric acid as electrolyte under the condition of a D.C. current density of 15 A/$dm^2$, washed and then dried. The thus treated aluminum plate was coated with the subbing solution described below, and dried at 80° C. for 30 seconds. The dry coverage was 10 mg/$m^2$.

| Composition of Subbing Solution: | |
|---|---|
| β-Alanine | 0.1 g |
| Phenylsulfonic acid | 0.05 g |
| Methanol | 40 g |
| Purified water | 60 g |

In the next place, five Solutions [A-1] to [A-5] were prepared so as to have the composition described below as Composition of Solution [A], wherein the compounds of formula (I) according to the present invention were different in sort from one another. Each of Solutions [A-1] to [A-5] was coated on the aluminum plate provided with the foregoing subbing layer, and dried at 100° C. for 2 minutes. Thus, positive working lithographic plate materials [A-1] to [A-5] were obtained. Therein, the dry coverage was 1.7 g/m².

| Composition of Solution [A]: | |
|---|---|
| Compound of formula (I) (set forth in Table 2) | 1.0 g |
| 2,6-Bis(trichloromethyl)-4-(4-methoxy-1-naphthyl)-s-triazine (compound named PAG2-4 hereinbefore) | 0.2 g |
| Infrared absorbent NK-3508 (produced by Nippon Kanko Shikiso Kenkyusho K.K.) | 0.15 g |
| Novolak resin prepared from cresols and formaldehyde (m/p ratio: 8/2, weight average molecular weight: 5,800) | 2.5 g |
| Dye (Victoria Pure Blue BOH having 1-naphthalene sulfonic acid ion as its counter ion) | 0.05 g |
| Megafac F-177 (fluorine-containing surfactant, produced by Dainippon Ink & Chemicals, Inc.) | 0.06 g |
| Methyl ethyl ketone | 20 g |
| Methyl alcohol | 7 g |

The compounds used in Solutions [A-1] to [A-5] are set forth in Table 2.

TABLE 2

| | Lithographic plate material | Compound used |
|---|---|---|
| Example 5 | [A-1] | Compound 5 |
| Example 6 | [A-2] | Compound 8 |
| Example 7 | [A-3] | Compound 11 |
| Example 8 | [A-4] | Compound 13 |
| Example 9 | [A-5] | Compound 4 |

The thus obtained positive working lithographic plate materials [A-1] to [A-5] were Kept for 5 days under a high temperature-high humidity condition, specifically under the condition of 35° C.–75% RH. Then, they were each exposed by means of YAG laser emitting an infrared ray of 1064 nm. After the exposure, the plate materials underwent a one-minute heat treatment at 110° C., and then processed with an automatic developing machine wherein the developer DP-4 (1:8) and the rinsing solution FR-3 (1:7) (produced by Fuji Photo Film Co., Ltd.) was placed. Then, the plate surface was treated with the gum solution GU-7 (1:1) (produced by Fuji Photo Film Co., Ltd.), and subjected to printing operations with a press, Heidelberger Druckmaschinen Aktiengesellschaft KOR-D. The thus obtained prints were examined by visual observation as to whether or not stains were generated on non-image areas. The observation results are shown in Table 3. The present plate materials gave satisfactory printed matters free from stains on non-image areas.

TABLE 3

| | Lithographic plate material | Scum in non-image area upon printing |
|---|---|---|
| Example 5 | [A-1] | absent |
| Example 6 | [A-2] | absent |
| Example 7 | [A-3] | absent |
| Example 8 | [A-4] | absent |
| Example 9 | [A-5] | absent |

Examples 10 to 17 and Comparative Examples 5 to 8

Synthesis Example 1
Synthesis of Resin containing acid-decomposable groups (Compound [B-1])

Poly(p-hydroxystyrene) (weight average molecular weight: 9,600) in an amount of 9 g was dissolved in 100 ml of dimethoxyethane, and thereto 12.6 g of 3,4-dihydro-2H-pyran and 0.5 ml of sulfuric acid were added. This solution was stirred for 15 hours at 30°–40° C. After the reaction was completed, the reaction solution was concentrated under reduced pressure. The residue obtained was neutralized with sodium carbonate, and then poured into water to precipitate crystals. The crystals were filtered off, washed with water and dried under reduced pressure. Thus, 11.0 g of poly(p-tetrahydropyranyloxystyrene-p-hydroxystyrene) was obtained as white powder. The ratio of the p-tetrahydropyranyloxystyrene units to the p-hydroxystyrene units in the polymer obtained was determined to be 3:7 by $^1$H-NMR analysis.

SYNTHESIS EXAMPLE 2
Synthesis of Resin containing acid-decomposable groups (Compound [B-2])

In an atmosphere of nitrogen, 22 g of the p-t-butoxycarbonyloxystyrene prepared using the method described in U.S. Pat. No. 4,491,628 was polymerized in toluene at 90° C. for 5 hours in the presence of 2,2'-azobis (2,4-dimethylvaleronitrile) catalyst. After cooling, the reaction solution was poured into methanol to deposit crystals. The crystals deposited was filtered off, washed with methanol, and dried under reduced pressure. Thus, 15 g of poly(p-tert-butoxycarbonyloxystyrene) was obtained as white powder. A 7 g portion of this powder was dissolved in 1,4-dioxane, and thereto 10 ml of conc. hydrochloric acid was added. This solution was refluxed with stirring for 2.5 hours. After cooling, the reaction solution was poured into water to deposit crystals. The thus deposited crystals was filtered off, washed with water, and dried under reduced pressure to yield 4 g of poly(p-tert-butoxycarbonyloxystyrene-p-hydroxystyrene) as white powder. The ratio of the p-tert-butoxycarbonyloxystyrene units to the p-hydroxystyrene units in the polymer obtained was determined to be 1:9 by $^1$H-NMR analysis.

SYNTHESIS EXAMPLE 3
Synthesis of Resin containing acid-decomposable groups (Compound [B-3])

Poly(p-hydroxystyrene) (weight average molecular weight: 9,600) in an amount of 12 g was dissolved in 120 ml of N,N-dimethylacetamide, and thereto 7 g of potassium carbonate and 9 g of t-butyl bromoacetate were added successively, followed by 7-hour stirring at 120° C. The reaction solution was treated in the same manner as that for the synthesis of Compound [B-2] to yield a resin having the following structure. The ratio of the acid-decomposable group-containing units to the p-hydroxystyrene units in the resin was determined to be 1:6 by $^1$H-NMR analysis.

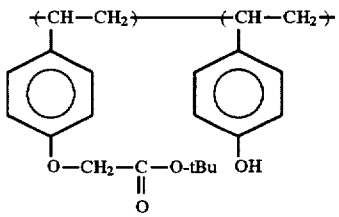

SYNTHESIS EXAMPLE 4
Synthesis of Dissolution Inhibitor (Compound [IN-1])

1-[α-methyl-α-(4'-hydroxyphenyl)ethyl]-4-[α',α'-bis(4"-hydroxyphenyl)ethyl]benzene in an amount of 42.4 g (0.10 mole) was dissolved in 300 ml of N,N-dimethylacetamide, and thereto 49.5 g (0.35 mole) of potassium carbonate and 84.8 g (0.33 mole) of cumyl bromoacetate were added. The resulting solution was stirred for 7 hours at 120° C. The reaction mixture obtained was poured into 2 liter of ion exchanged water, neutralized with acetic acid, and then extracted with ethyl acetate. The extracts obtained was concentrated, and purified by column chromatography (carrier: silica gel, developing solvent: ethyl acetate/n-hexane (3/7 by volume) mixture). Thus, 70 g of the following compound (in which all R groups were —CH$_2$COOC(CH$_3$)$_2$C$_6$H$_5$) was obtained.

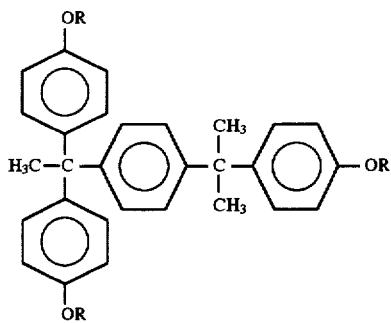

Synthesis Example 5
Synthesis of Dissolution Inhibitor (Compound [IN-2])

α,α,α',α',α",α"-hexakis(4-hydroxyphenyl) 1,3,5-triethylbenzene in an amount of 14.3 g (0.020 mole) was dissolved in 120 ml of N,N-dimethylacetamide, and thereto 21.2 g (0.15 mole) of potassium carbonate and 27.1 g (0.14 mole ) of t-butyl bromoacetate were added. The resulting solution was stirred for 7 hours at 120° C. The reaction mixture obtained was poured into 1.5 liter of water, and then extracted with ethyl acetate. After drying with magnesium sulfate, the extracts obtained was concentrated, and purified by column chromatography (carrier: silica gel, developing solvent: ethyl acetate/n-hexane (2/8 by volume) mixture). Thus, 24 g of light yellow powder was obtained. This yellow powder was confirmed to be the following compound (in which all R groups were —CH$_2$—COO—C$_4$H$_9$(t)) by NMR measurement.

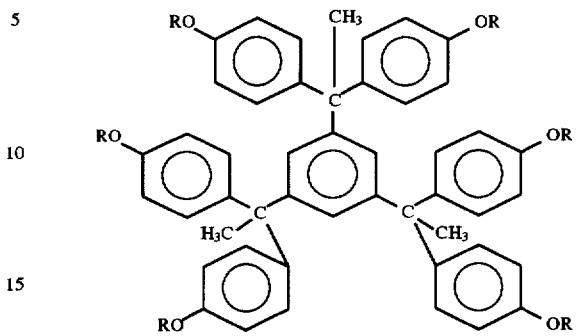

Preparation and Evaluation of Photosensitive Compositions

Each group of ingredients shown in Table 4 were dissolved in 6 g of diglime, and passed through a 0.2 μm filter to prepare each resist solution. This resist solution was coated on a silicon wafer by means of a spin coater revolving at 3,000 r.p.m., and dried for 60 seconds at 90° C. on a hot plate of vacuum adsorption type, thereby forming a 1.0 μm-thick resist film.

The thus formed resist films were each exposed by means of a 248 nm KrF excimer laser stepper (NA=0.45). After the exposure, each of the films was baked for 60 seconds with a 110° C. hot plate of vacuum adsorption type, followed at once by 60-second dipping in a water solution of tetramethylammonium hydroxide (TMAH) (the concentration of which is described below). Further, it was rinsed with water for 30 seconds, and then dried. The thus formed patterns on silicon wafers were observed under a scanning electron microscope, and thereby the resist profile was evaluated. The evaluation results are shown in Table 5.

|  | Developer used |
| --- | --- |
| Examples 12 to 17 | 2.38% TMAH |
| Comparative Examples 7 and 8 | 2.38% TMAH |
| Example 10 and 11 | 1.19% TMAH |
| Comparative Examples 5 and 6 | 1.19% TMAH |

The sensitivity was defined as the reciprocal of the exposure amount required for the reproduction of a 0.50 μm mask pattern, and the sensitivity values shown in Table 5 are relative values, with Comparative Example 1 being taken as 1.0.

The film shrinkage was expressed in terms of the percentage of the film thickness ratio between before and after the post exposure bake.

The resolution was represented by the limiting resolution under the exposure amount required for the reproduction of a 0.50 μm mask pattern.

The resist profile was evaluated by the angle (θ) of a resist side wall formed with the silicon wafer plane in the cross section of a 0.50 μm mask pattern.

TABLE 4

| Example No. | Binder resin | Amount added (g) | Present sulfonimide | Amount added (g) | Dissolution inhibitor | Amount added (g) | Photo-acid generator | Amount added (g) |
|---|---|---|---|---|---|---|---|---|
| 10 | Poly(p-hydroxystyrene) Mw = 10,000 | 1.4 | Compound 1 | 0.60 | — | | PAG3-2 | 0.05 |
| 11 | Poly(p-hydroxystyrene) Mw = 10,000 | 1.4 | Compound 2 | 0.30 | IN-1 | 0.30 | PAG4-3 | 0.05 |
| 12 | p-Hydroxystyrene/styrene (8/2) copolymer, Mw = 25,000 | 1.4 | Compound 5 | 0.60 | — | | PAG4-2 | 0.05 |
| 13 | p-Hydroxystyrene/styrene (8/2) copolymer, Mw = 25,000 | 1.4 | Compound 6 | 0.30 | IN-2 | 0.30 | PAG4-1 | 0.05 |
| 14 | B-1 | 1.4 | Compound 10 | 0.60 | — | | PAG5-2 | 0.05 |
| 15 | B-2 | 1.4 | Compound 12 | 0.60 | — | | PAG3-2 | 0.05 |
| 16 | B-3 | 1.4 | Compound 14 | 0.60 | — | | PAG4-3 | 0.05 |
| 17 | B-3 | 1.4 | Compound 17 | 0.30 | IN-2 | 0.30 | PAG4-2 | 0.05 |
| Compar. Ex. 5 | Poly(p-hydroxystyrene) | 1.4 | — | | IN-1 | 0.60 | PAG4-2 | 0.05 |
| Compar. Ex. 6 | " | 1.7 | — | | IN-1 | 0.30 | PAG3-2 | 0.05 |
| Compar. Ex. 7 | B-3 | 1.4 | — | | IN-2 | 0.60 | PAG4-1 | 0.05 |
| Compar. Ex. 8 | B-3 | 1.4 | — | | IN-2 | 0.30 | PAG4-2 | 0.05 |

TABLE 5

| | Relative sensitivity | Film shrinkage | Resolution (μm) | Resist profile (θ) |
|---|---|---|---|---|
| Example 10 | 1.5 | 1% | 0.26 [0.26] | 87° |
| Example 11 | 1.4 | 2% | 0.28 [0.30] | 88° |
| Example 12 | 1.6 | 1% | 0.25 [0.25] | 89° |
| Example 13 | 1.4 | 2% | 0.27 [0.28] | 88° |
| Example 14 | 1.4 | 1% | 0.25 [0.25] | 88° |
| Example 15 | 1.4 | 1% | 0.25 [0.25] | 88° |
| Example 16 | 1.7 | 1% | 0.24 [0.24] | 89° |
| Example 17 | 1.6 | 1% | 0.27 [0.27] | 87° |
| Compar. Ex. 5 | 1.0 | 4% | 0.31 [0.37] | 83° |
| Compar. Ex. 6 | 1.2 | 2% | 0.33 [0.45] | 78° |
| Compar. Ex. 7 | 0.6 | 4% | 0.30 [0.40] | 84° |
| Compar. Ex. 8 | 0.8 | 4% | 0.32 [0.45] | 80° |

Resolution (μm): The unparenthesized values are resolutions determined under a condition that the resist films were baked immediately after the exposure and then developed; while the values in the brackets are resolutions determined under a condition that the resist films were allowed to stand for 30 minutes after the exposure, baked and then developed.

As can be seen from Table 5, the present resist films were less in film shrinkage due to post exposure baking and had better profile, higher sensitivity and higher resolutions than the comparative resist films. Further, the present resist films were almost free from the deterioration of their resolution due to the lapse of a time between exposure and baking (heat treatment), indicating that they had excellent stability.

Examples 18 and 19

The surface of a 0.30 mm-thick aluminum plate was grained with a nylon brush and a water suspension of pumice stone of 400 mesh, and thoroughly washed with water. Then, the aluminum plate was etched by being dipped for 60 seconds in a 10% sodium hydroxide solution kept at 70° C., followed by washing with running water. Further, the aluminum plate was washed with 20% $HNO_3$ for neutralization, followed by washing with water. Furthermore, the electrolytic surface-roughening treatment of the aluminum plate was carried out in a 1% water solution of nitric acid by furnishing anode electricity in a quantity of 160 coulomb/$dm^2$ using a sinusoidal alternating waveform current under $V_A=12.7$ V. The thus treated aluminum plate had the surface roughness of 0.6μ (expressed in terms of Ra). Subsequently, the aluminum plate was desmutted by being dipped for 2 minutes in a 30% water solution of sulfuric acid kept at 55° C., and further anodized in a 20% water solution of sulfuric acid under the electric current density of 2 A/$dm^2$ so as to have a thickness of 2.7 g/$m^2$. On the thus prepared aluminum support, each of the following photosensitive solutions A and B was coated using a whirler at a rotating speed of 200 r.p.m., and dried for 1 minute at 100° C.

| Composition of Photosensitive Solution A (Example 18): | |
|---|---|
| Sulfonimide polymer (P-1) of Synthesis Example 1 | 5 g |
| 4-p-Tolylmercapto-2,5-diethoxybenzenediazonium hexafluorophosphate | 0.5 g |
| Dibutyltin laurate | 0.001 g |
| Diethylene glycol dimethyl ether | 45 g |
| Composition of Photosensitive Solution B (Example 19): | |
| Sulfonimide polymer (P-2) of Synthesis Example 2 | 3.2 g |
| Phthalic acid anhydride | 5 mg |
| o-Chlorophenol | 1 mg |
| 4-p-Tolylmercapto-2,5-diethoxybenzenediazonium hexafluorophosphate | 0.5 g |
| Diethylene glycol dimethyl ether | 27 g |

The presensitized plate having a coating of Photosensitive Solution B was further heated for 1 hour at 140° C. Then, each plate was subjected to 500 count exposure by means of a printer, Eye Rotary Printer (made by EYE-Graphics Co., Ltd.).

After the exposure, each plate was subjected to one-minute heat treatment at 100° C. and, without undergoing any development-processing, set in an offset printer, HARRIS AURELIA 125, followed by printing operations.

Thus, 3,000 sheets of stain-free prints were obtained when the printing plate having a coating of Photosensitive Solution A was used; while 4,000 sheets of stain-free prints were obtained when the printing plate having a coating of Photosensitive Solution B was used.

The positive image forming compositions according to the present invention can provide resist compositions which ensure a reduction in film shrinkage due to post exposure baking, satisfactory profile and high resolution, and hardly cause the deterioration of resolution due to the lapse of a time between exposure and heat treatment because of their excellent stability. Further, the present compositions can provide offset printing plates having high sensitivities to light of wavelengths covering from UV region to infrared region and no scum in non-image areas.

While the invention has been described in detail and with reference to specific embodiments thereof, it will be apparent to one skilled in the art that various changes and modifications can be made therein without departing from the spirit and scope thereof.

What is claimed is:

1. A positive image forming composition comprising (a) a compound generating an acid by the action of light or heat thereon and (b) a sulfonimide compound represented by the following formula (I):

$$L_1-(SO_2-N_2-SO_2-R_1)_n \qquad (I)$$

wherein n is an integer from 1 to 6; $R_1$ represents an unsubstituted or substituted aromatic group or an unsubstituted or substituted alkyl group; $L_1$ represents an unsubstituted or substituted aromatic group or an unsubstituted or substituted alkyl group when n is 1, and it represents an unsubstituted or substituted polyvalent linkage group constituted of non-metallic atoms when n is from 2 to 6; and $R_2$ represents a substituted or unsubstituted alkoxymethyl group, a substituted or unsubstituted arylmethyl group, or a substituted or unsubstituted alicyclic alkyl group.

2. The positive image forming composition according to claim 1, wherein the $R_2$ group in the sulfonimide compound of formula (I) is a benzyloxymethyl group, a methoxyethoxymethyl group, a tetrahydropyranyl group or a tetrahydrofuranyl group.

3. The positive image forming composition according to claim 1, wherein the $R_2$ group in the sulfonimide compound of formula (I) is a p-methoxybenzyl group, a 2,4,6-trimethoxybenzyl group, a piperonyl group or a 9-anthranylmethyl group.

4. The positive image forming composition according to claim 1, wherein the $R_2$ group in the sulfonimide compound of formula (I) is a cyclohexyl group or a dibenzosuberyl group.

5. The positive image forming composition according to claim 1, wherein the compound as component (a) is at least one compound selected from the group consisting of trihalomethyl-substituted oxazole compounds, trihalomethyl-substituted s-triazine compounds, iodonium salts, sulfonium salts, diazonium salts, disulfone compounds and iminosulfonate compounds.

6. The positive image forming composition according to claim 1, which further comprises a high molecular organic binder insoluble in water but soluble or at least swelling in an aqueous alkali solution.

7. The positive image forming composition according to claim 1, which further comprises an infrared absorbing dye.

8. The positive image forming composition according to claim 1, wherein the sulfonimide compound as component (b) is a sulfonimide compound of formula (I) wherein $R_1$ is a 4-methylphenyl group, n is 1, $L_1$ is a 4-methylphenyl group and $R_2$ is a benzyloxymethyl group, a p-methoxybenzyl group or a piperonyl group.

9. A positive image forming composition comprising (a) a compound generating an acid by the action of light or heat thereon and (b) a polymer containing in side chains constitutional units represented by the following formula (I'):

$$-L-SO_2-NR^2-SO_2-R^1 \qquad (I')$$

wherein $R^1$ represents an unsubstituted or substituted aromatic group, or an unsubstituted or substituted alkyl group; L represents a polyvalent organic group constituted of nonmetal atoms for connecting the constitutional unit of formula (I') to the polymer skeleton; and $R^2$ represents a substituted or unsubstituted alkoxymethyl group, a substituted or unsubstituted arylmethyl group, or a substituted or unsubstituted alicyclic alkyl group.

* * * * *

UNITED STATES PATENT AND TRADEMARK OFFICE
CERTIFICATE OF CORRECTION

PATENT NO. : 5,731,123
DATED : March 24, 1998
INVENTOR(S) : K. Kawamura, et al.

It is certified that error appears in the above-indentified patent and that said Letters Patent is hereby corrected as shown below:

In column 47, line 20, the formula should read: $L_1\text{-}(SO_2\text{-}NR_2\text{-}SO_2\text{-}R_1)_n$ Signed and Sealed this Fourth Day of August, 1998

Attest:

Attesting Officer

BRUCE LEHMAN

Commissioner of Patents and Trademarks